US012701788B2

(12) United States Patent
Li et al.

(10) Patent No.: US 12,701,788 B2
(45) Date of Patent: Aug. 4, 2026

(54) INVERTER WITH BACKSIDE POWER DELIVERY NETWORK

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Tsung-Sheng Kang, Ballston Lake, NY (US); Oleg Gluschenkov, Tannersville, NY (US)

(73) Assignee: International Business Machines Corporation, Armonk, NY (US)

(*) Notice: Subject to any disclaimer, the term of this patent is extended or adjusted under 35 U.S.C. 154(b) by 321 days.

(21) Appl. No.: 18/147,699

(22) Filed: Dec. 28, 2022

(65) Prior Publication Data

US 2024/0222378 A1 Jul. 4, 2024

(51) Int. Cl.

*H10D 84/03* (2025.01)
*H10D 86/00* (2025.01)
*H10D 88/00* (2026.01)

(52) U.S. Cl.

CPC ........... *H10D 86/00* (2025.01); *H10D 84/038* (2025.01); *H10D 88/01* (2025.01)

(58) Field of Classification Search

None

See application file for complete search history.

(56) References Cited

U.S. PATENT DOCUMENTS

| | | | | |
|---|---|---|---|---|
| 11,664,433 | B2 * | 5/2023 | Hong | H10D 30/43 257/288 |
| 12,001,772 | B2 * | 6/2024 | Chu | G06F 30/392 |
| 12,131,996 | B2 * | 10/2024 | Park | H10W 20/427 |
| 12,165,973 | B2 * | 12/2024 | Chien | H10D 64/017 |
| 2012/0248544 | A1 * | 10/2012 | Yokoyama | H10D 30/797 438/455 |

(Continued)

FOREIGN PATENT DOCUMENTS

EP 3324436 A1 5/2018

OTHER PUBLICATIONS

Savidis, I. et al., "Power Grid Noise in TSV-Based 3-D Integrated Systems", https://citeseerx.ist.psu.edu/viewdoc/download?doi=10.1.1.300.7808&rep=rep1&type=pdf, downloaded 2022, 4 pgs. (IEEE 2013).

*Primary Examiner* — Nishath Yasmeen

(74) *Attorney, Agent, or Firm* — Scully, Scott, Murphy & Presser, P.C.; Samuel A. Waldbaum

(57) ABSTRACT

A semiconductor device includes a first field effect transistor (FET) and a second FET arranged under the first FET to form a stack on the frontside of a wafer. A Middle of Line (MOL) contact has a first end connected to a source or drain of the first FET, and a second end connected to a first voltage node. A direct backside contact is connected to a backside power delivery network, the direct backside contact has a first end connected to a source or drain of the second FET, and a second end connected to a second voltage node. A Back End of Line (BEOL) layer has an input signal line and an output signal line. A gate region connects the MOL contact to the input signal line at the BEOL. The first FET and the second FET are connected through the MOL contact to the output signal line.

15 Claims, 21 Drawing Sheets

(56) References Cited

U.S. PATENT DOCUMENTS

| | | | | |
|---|---|---|---|---|
| 2019/0148376 | A1* | 5/2019 | Chanemougame | H10D 30/6219 257/532 |
| 2020/0176324 | A1* | 6/2020 | Zang | H10D 84/038 |
| 2020/0266169 | A1 | 8/2020 | Kang et al. | |
| 2021/0043755 | A1 | 2/2021 | Mehandru et al. | |
| 2021/0366906 | A1* | 11/2021 | Huang | H10D 84/85 |
| 2022/0045011 | A1 | 2/2022 | Sio et al. | |
| 2022/0077857 | A1 | 3/2022 | Chen et al. | |
| 2022/0130759 | A1 | 4/2022 | Huang et al. | |
| 2022/0181258 | A1* | 6/2022 | Liebmann | H10W 20/427 |
| 2022/0181321 | A1 | 6/2022 | Kang et al. | |
| 2022/0406715 | A1* | 12/2022 | Xie | H10D 64/017 |
| 2023/0170395 | A1* | 6/2023 | Xie | H10D 64/254 257/401 |

* cited by examiner

Section X

Section Y1

Section X

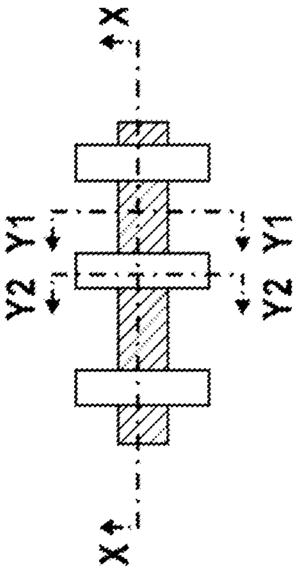
FIG. 4A
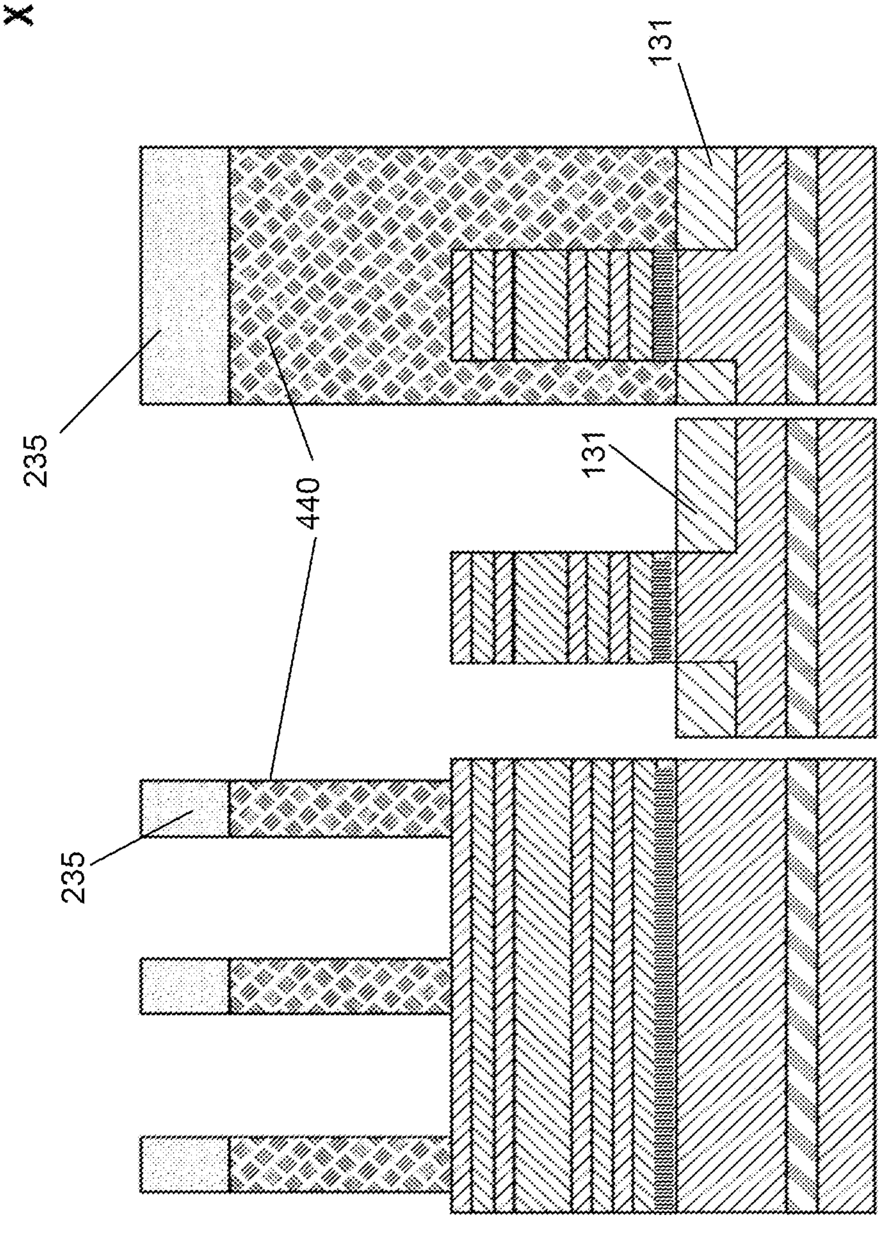
Section X
FIG. 4B
Section Y1
FIG. 4C
Section Y2
FIG. 4D

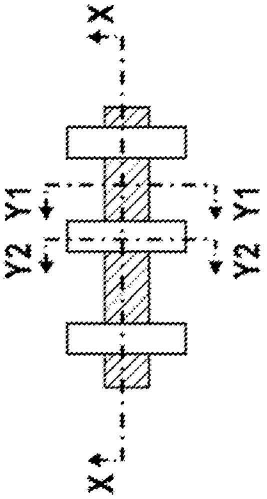
FIG. 6A
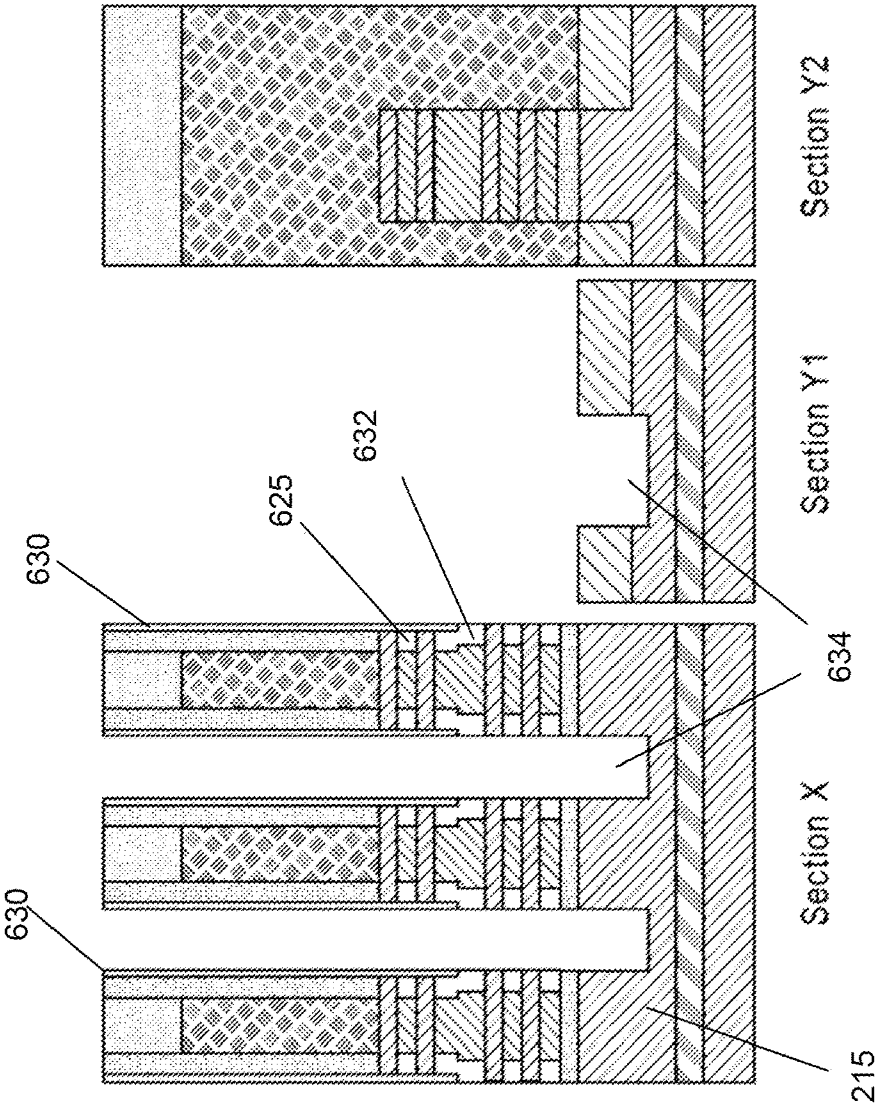
FIG. 6B
FIG. 6C
FIG. 6D

Section X

Section Y1

Section Y2

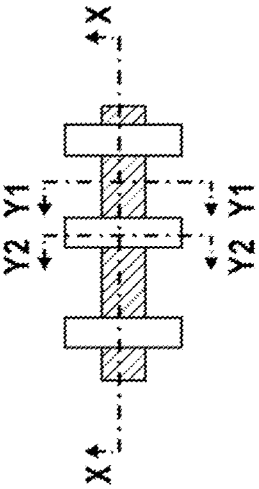
FIG. 8A
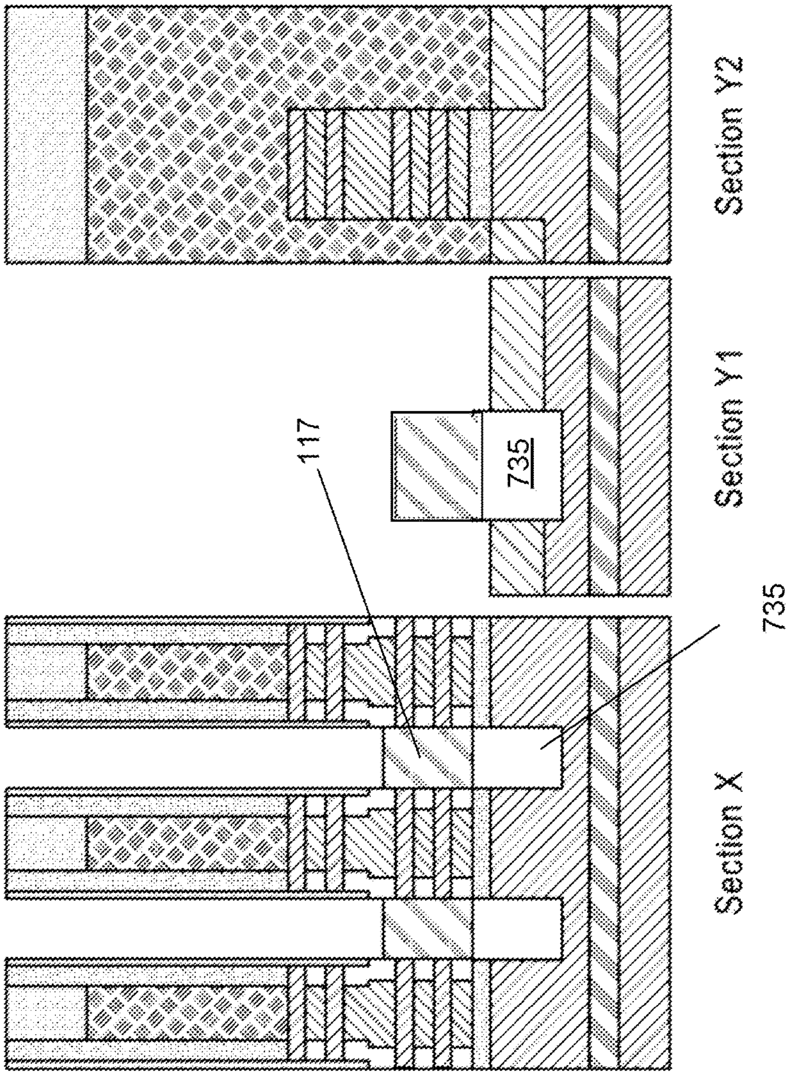
Section X
FIG. 8B
Section Y1
FIG. 8C
Section Y2
FIG. 8D Section X Section Y1

Section Y2

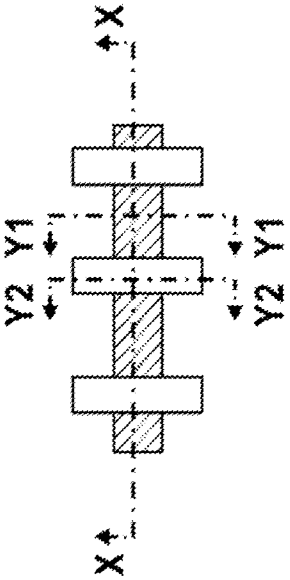
FIG. 12A
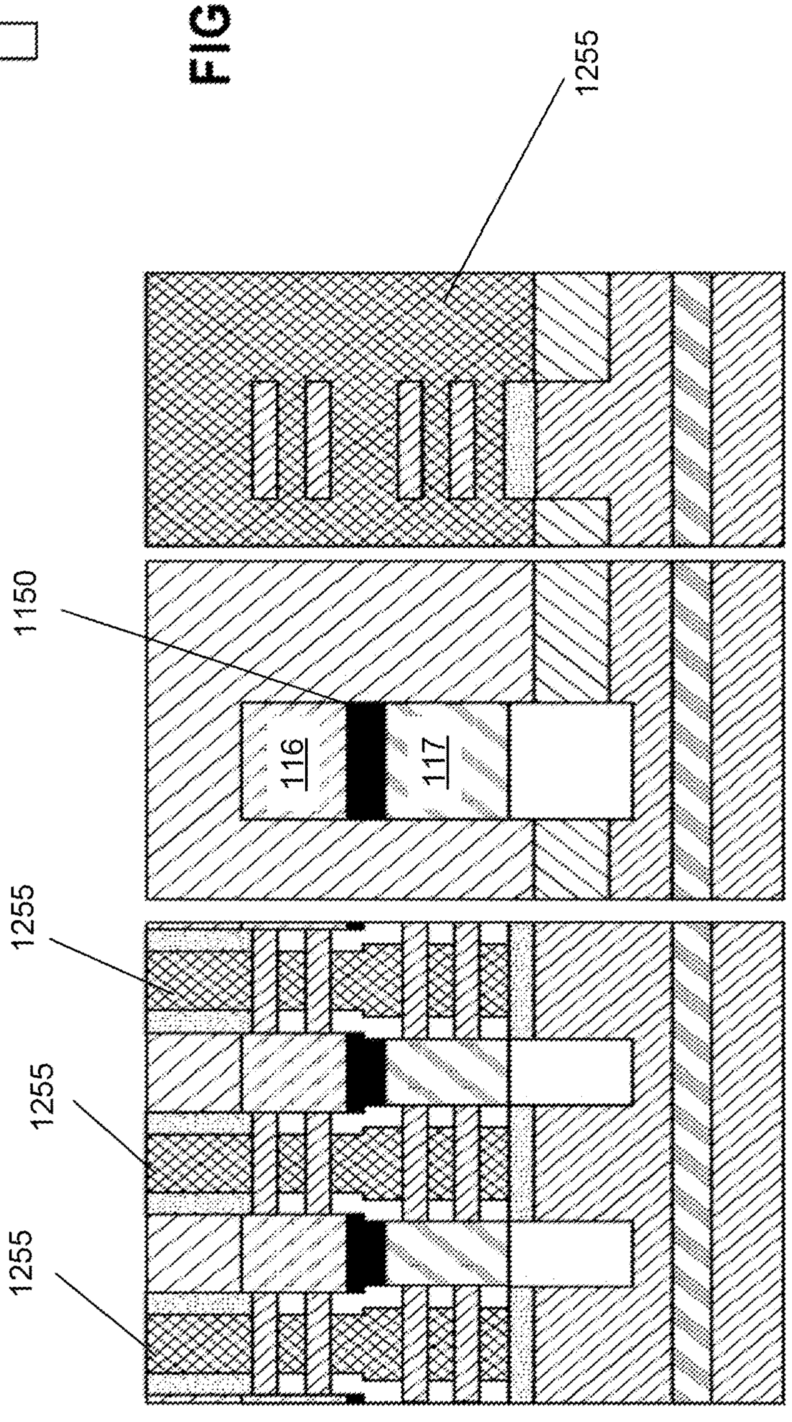
Section X
FIG. 12B
Section Y1
FIG. 12C
Section Y2
FIG. 12D Section X Section Y1

Section Y2

Section X

Section Y1

Section Y2

Section X

Section Y1

Section Y2

Section Y2

Section Y1

Section X

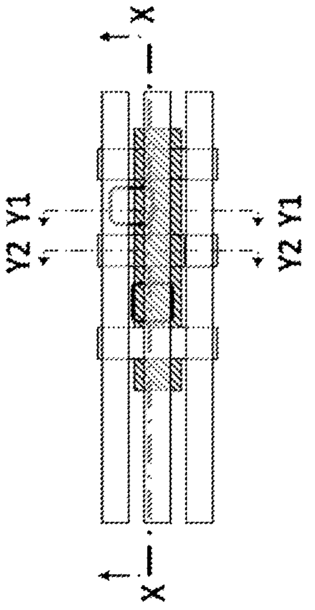
FIG. 19A
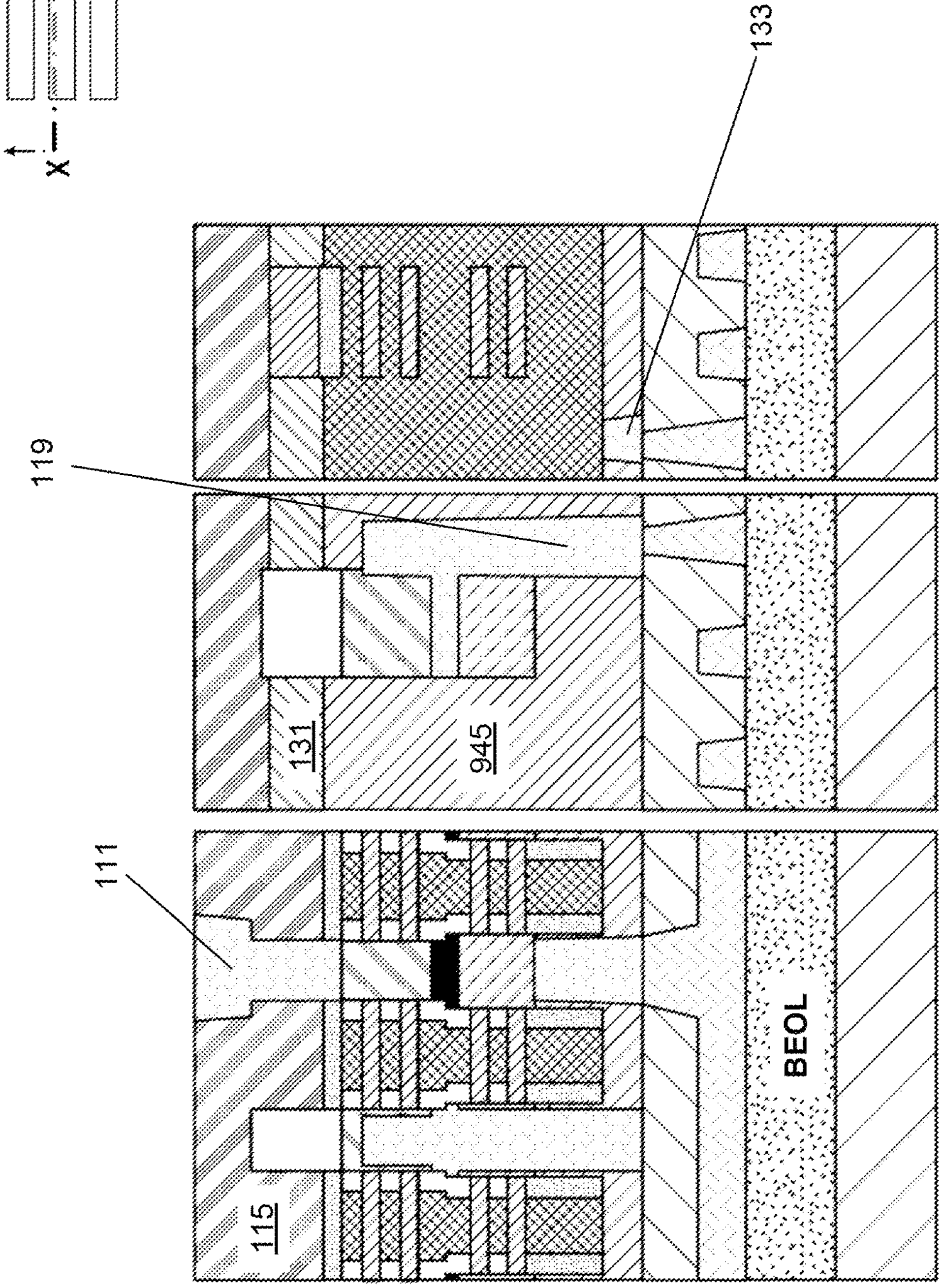
Section X
FIG. 19B
Section Y1
FIG. 19C
Section Y2
FIG. 19D

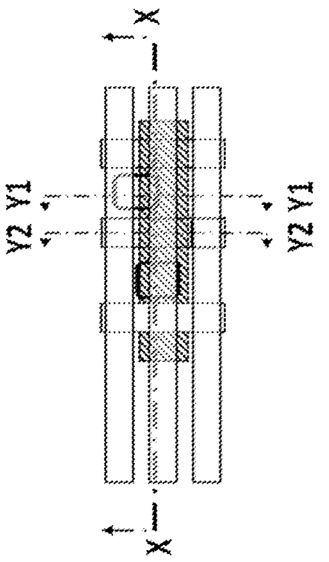
FIG. 20A
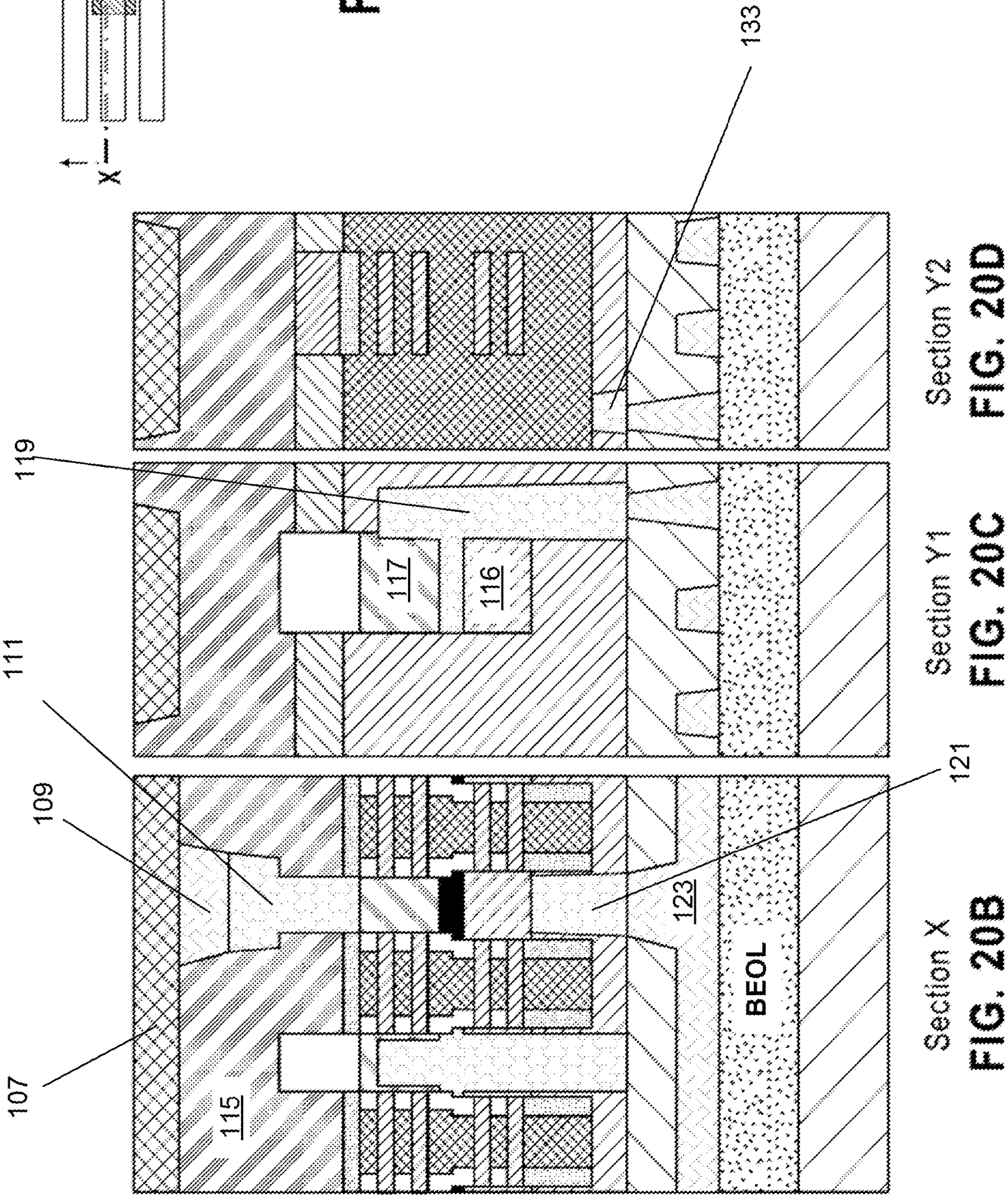
Section X
FIG. 20B
Section Y1
FIG. 20C
Section Y2
FIG. 20D

INVERTER WITH BACKSIDE POWER DELIVERY NETWORK

BACKGROUND

Technical Field

The present disclosure generally relates to semiconductor devices, and more particularly, to a structure and method of routing signal and power lines in semiconductor devices having a Backside Power Delivery Network (BSPDN).

Description of the Related Art

Complementary metal-oxide-semiconductor (CMOS) inverters use a shared gate for an input signal between an n-channel field effect transistor (nFET) and a p-channel field effect transistor (pFET). In an effort to reduce a footprint, the vertical stacking of nFET and pFET has been developed. There has been additional development with regard to combining a stacked nanosheet FET (nFET and pFET) with a BSPDN. Such structures have duplicative input and output signal lines distributed at both the Back End of Line (BEOL) and the BSPDN. It is unnecessary to have both input and output signal lines at the BEOL and the BSPDN.

Accordingly, there is a need for an inverter semiconductor that removes the redundancy of having both input and output signal lines at two different portions of the semiconductor.

SUMMARY

According to an embodiment, a semiconductor device includes a wafer having a frontside and a backside. A first field effect transistor (FET) having a first conductivity, the first FET arranged on the frontside of the wafer. A second FET having a second conductivity, the second FET arranged under the first FET to form a stack, and the second FET is arranged on the frontside of the wafer. A Middle of Line (MOL) contact has a first end connected to a source or drain of the first FET, and a second end connected to a first voltage node (e.g., Vdd). A direct backside contact is connected to a backside power delivery network (BSPDN), the direct backside contact having a first end connected to a source or drain of the second FET, and a second end connected to a second voltage node (e.g., Vss). A Back End of Line (BEOL) formed on the frontside of the wafer has an input signal line and an output signal line. A gate region connects the MOL contact to the input signal line at the BEOL. The first FET and the second FET are connected through the MOL contact to the output signal line at the BEOL. This structure provides a stacked finFET device with a more efficient routing of the input and output signal lines to one side of a BEOL and provides power at the backside.

In one embodiment, which may be combined with the previous embodiments, a stacked inverter device includes a middle connection, wherein the first FET is connected to the second FET through the middle connection. The middle connection permits a pair of transistors to connect to a common output signal contact.

In one embodiment, which may be combined with the previous embodiments, the middle connection includes a single metallic compound. The single metallic compound facilitates manufacturing of the semiconductor device.

In one embodiment, which may be combined with the previous embodiments, the middle connection includes two or more metallic compounds. Having two metallic contacts facilitates a connection to the pair of transistors and may reduce connection issues associated with routing.

In one embodiment, which may be combined with the previous embodiments, the first FET is a p-type FET (pFET), and the second FET is an n-type FET (nFET). For an inverter, a pFET and nFET are preferred due to the performance of the transistor pair.

In one embodiment, which may be combined with the previous embodiments, the pFET is a top pFET epitaxial (epitaxy) material, and the nFET is a bottom nFET epitaxy material. In the arrangement of Vdd and Vss, a nanosheet FET with a top pFET and a bottom nFET has enhanced performance and easier construction over other configurations.

In one embodiment, which may be combined with the previous embodiments, the gate region comprises a replacement metal gate (RMG) and a high-k metal gate (HKMG) material. The RMG and HKMG materials provide for an improved connection.

In one embodiment, which may be combined with the previous embodiments, a plurality of input signals and a plurality of output signals are all arranged at the BEOL on the frontside of the wafer.

In one embodiment, which may be combined with the previous embodiments, an inverter having both the input signal line and the output signal line routed through a wafer frontside at the BEOL. A more efficient operation occurs by routing the input and output signals through the frontside at the BEOL.

In one embodiment, which may be combined with the previous embodiments, an input contact for the input signal line and an output contact for the output signal line are provided only on the frontside of the wafer without duplication. This structure is an improvement over conventional structures that route the signal inputs and output to multiple sides of the structure, which involves more space and a more complex wiring.

In one embodiment, which may be combined with the previous embodiments, an inverter semiconductor device includes at least one transistor stack including a top field effect transistor (FET) having a first conductivity arranged over a bottom FET having a second conductivity different than the first conductivity, the top FET and the bottom FET is made of an epitaxial material. The top FET and bottom FET have different conductivity, such as p-type and n-type.

In one embodiment, which may be combined with the previous embodiments, the top FET is connected to a first voltage node (e.g., Vdd) routed through a Middle of Line (MOL) to the Back End of Line (BEOL). This construction is more efficient than conventional stacked structures.

In one embodiment, which may be combined with the previous embodiments, the bottom FET is connected to a second voltage node (e.g., Vss) through a direct backside contact to a backside power delivery network (BSPDN). A gate is arranged to connect the MOL contact to an input signal line at the BEOL. The bottom FET and the top FET are connected to an output signal line at the BEOL. The construction is more efficient by connecting to the output signal line at the BEOL.

In one embodiment, which may be combined with the previous embodiments the top FET and the bottom FET are connected together through a middle connection. The middle connection facilitates routing the signals of the two FETs.

In one embodiment, which may be combined with the previous embodiments, the input signal line comprises a plurality of signal lines, and the output signal line comprises a plurality of output signal lines, and all of the input signal lines and all of the output signals lines are arranged at the BEOL. The arrangement of all of the signal lines at the BEOL eliminates duplicative connections.

In one embodiment, which may be combined with the previous embodiments, the top FET is a top pFET epitaxy, and the bottom FET is an nFET bottom epitaxy. With an arrangement of Vdd and Vss as shown in the drawings, the arrangement of a top pFET and a bottom nFET provides for a smoother operation.

In one embodiment, which may be combined with the previous embodiments, the gate is a replacement metal gate (RMG) comprising a high-k metal gate (HKMG) material. The RMG benefits from the high dielectric and metal structure in combination.

In one embodiment, which may be combined with the previous embodiments, a carrier wafer is connected to a top of the BEOL interconnect layers for wafer flipping and wafer backside processing. The carrier wafer facilitates construction of the device.

In one embodiment, which may be combined with the previous embodiments, the method includes flipping the wafer and removing a substrate. The flipping of the substrate facilitates the manufacture of the device.

According to one embodiment, a method of forming a semiconductor device, the method includes providing a wafer having a backside and a frontside. A first field effect transistor (FET) having a first conductivity is arranged on the frontside of the wafer. A second FET having a second conductivity different than the first conductivity is arranged under the first FET to form a stack on the frontside of the wafer. A Middle of Line (MOL) contact is arranged on the frontside of the wafer. The MOL has a first end connected to a source or drain of the first FET, and a second end connected to a first voltage node (e.g., Vdd). A direct backside contact is connected to a backside power delivery network (BSPDN), the direct backside contact has a first end connected to a source or drain of the second FET, and a second end connected to a second voltage node (Vss). A Back End of Line (BEOL) layer on the frontside of the wafer having an input signal line and an output signal line. A gate region is formed that connects the MOL contact to the input signal line at the BEOL layer. The first FET and the second FET are both connected to the output signal line at the BEOL.

In one embodiment, which may be combined with the previous embodiments, the method includes forming on a substrate a stack of nanosheets, patterning the nanosheets and forming a shallow trench isolation (STI) on a substrate. The providing of a transistor stack provides a stacked nanosheet FET with a backside power delivery network and more efficient routing.

In one embodiment, which may be combined with the previous embodiments, a dummy gate and a bottom dielectric isolation (BDI) layer are formed on the nanosheets. A recess is provided for the first pFET, the second nFET, a SiGe indentation, and an inner space formation on the stack of nanosheets.

In one embodiment, which may be combined with the previous embodiments, the dummy gate is removed and a replacement metal gate (RMG) is arranged in place of the dummy gate. Operations are performed including MOL patterning, a divot removal from between the first FET and the second FET, and filling a metal in place of the removed divot and for the MOL patterning. The gate is protected by the use of the dummy gate until the RMG replacement is performed.

In one embodiment, which may be combined with the previous embodiments, a carrier wafer is bonded to the BEOL, the wafer is flipped, and backside removal on the substrate is performed to remove at least an etch stop arranged on the substrate, an Si recess, and a backside interdielectric layer (BILD) fill. The etch stop layer protects the substrate from being overground, and removal of the BILD facilitates BSCA and BSPDN formation.

In one embodiment, which may be combined with the previous embodiments, a backside source or drain contact patterning, removing a placeholder forming a backside source and drain contact and a backside power delivery network (BSPDN). The backside source and drain contact and the BSPDN facilitate providing power at the backside of the structure.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIGS. 4A, 4B, 4C, and 4D illustrate a top view showing sectioning and cross-sectional views of a process flow for fabricating an inverter semiconductor device after a dummy gate formation, consistent with an illustrative embodiment.

FIGS. 6A, 6B, 6C, and 6D illustrate a top view showing sectioning and cross-sectional views of a process flow for fabricating an inverter semiconductor device after the formation of multiple substeps including a top FET NS recess, a top FET sacrificial layer indentation, a top FET inner space formation, a liner deposition and breakthrough, a bottom FET NS recess, a placeholder region recess, a bottom FET sacrificial layer indentation and a bottom FET inner spacer formation, consistent with an illustrative embodiment.

FIGS. 8A, 8B, 8C, and 8D illustrate a top view showing sectioning and cross-sectional views of a process flow for fabricating an inverter semiconductor device after NFET epitaxy growth, consistent with an illustrative embodiment.

FIGS. 12A, 12B, 12C, and 12D illustrate a top view showing sectioning and cross-sectional views of a process flow for fabricating an inverter semiconductor device after a stacked RMG formation, consistent with an illustrative embodiment.

FIGS. 19A, 19B, 19C, and 19D illustrate a top view showing sectioning and cross-sectional views of a process flow for fabricating an inverter semiconductor device after a self-align placeholder removal and backside source and drain contact formation, consistent with an illustrative embodiment.

FIGS. 20A, 20B, 20C, and 20D illustrate a top view showing sectioning and cross-sectional views of a process flow for fabricating an inverter semiconductor device after a backside interconnect formation at M0 and V0 levels, consistent with an illustrative embodiment.

DETAILED DESCRIPTION

Overview

Figures 1A, 1B, 1C, 1D:
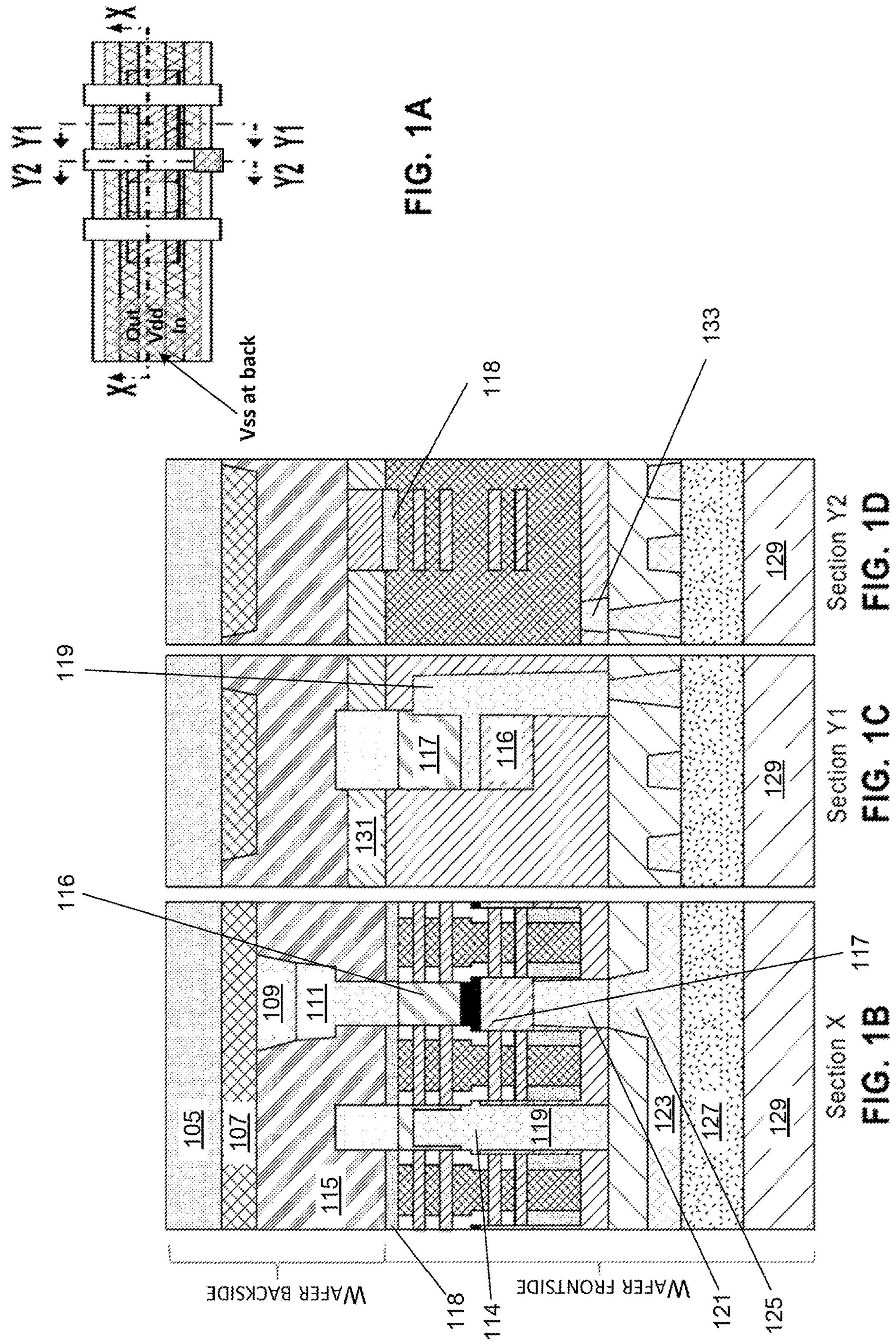
FIGS. 1A, 1B, 1C, and 1D illustrate a top view showing sectioning and cross-sectional views of an inverter semiconductor device, consistent with an illustrative embodiment.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

In discussing the present technology, it may be helpful to describe various salient terms. In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Example Architecture

FIGS. 1A, 1B, 1C, and 1D illustrate a top view showing sectioning and cross-sectional views of an inverter semiconductor device, consistent with an illustrative embodiment. FIG. 1B is a cross-section taken along the X-X line view in FIG. 1A, FIG. 1C is a view along the Y1-Y1 section, and FIG. 1D is a cross-section along Y2-Y2 along the gate.

FIG. 1B illustrates a wafer having a frontside and a backside. The backside includes at least a backside power delivery network (BSPDN) 105, a Backside M0 (BSM0_VSS) 107, a Backside V0 (BSV0) 109, a direct backside source or drain contact (BSCA_VSS) 111, and a Backside Interlayer Dielectric (BILD) 115.

The frontside of the wafer includes a top pFET epitaxy 116 and a bottom nFET epitaxy 117, a bottom dielectric isolation (BDI) layer 118, an output contact (CA_Out) 119, a source or drain Vdd contact (CA_Vdd) 121, a Middle of Line interconnect (M0_Vdd) 123, a V0 125, a Back End of Line (BEOL) 127, and a carrier wafer 129. The top pFET epitaxy 116 connects to Vdd through an MOL contact M0_Vdd 123 to BEOL 127. The BEOL 127 may include a plurality of metal layers that may interconnect devices with wiring layers on the wafer. The bottom nFET epitaxy 117 connects to Vss through direct backside source or drain contact BSCA_VSS 111 to BSPDN 105. The carrier wafer 129 is bonded to the top of the BEOL 127 and acts as a substrate to enable safe handling and processing during semiconductor fabrication. Both the bottom nFET epitaxy 117 and the top pFET epitaxy 116 are connected to the MOL contact to output a signal line at the BEOL, and the bottom nFET epitaxy 117 and the top pFET epitaxy 116 are connected together through a middle connection 114 between them.

FIG. 1C and FIG. 1D shows the wafer from the Y1 and Y2 sections, respectively. The Y1 section shown in FIG. 1C shows the contact for the output signals CA_Out 119 and in FIG. 1C the contact is shown as contacting both the top pFET epitaxy 116 and the bottom nFET epitaxy 117. The Shallow Trench Isolation (STI) 131 is also shown in FIG. 1C. FIG. 1D shows the contact for the gate input signals CB_In 133. The contact CB_In 133 for the gate input signals and contact CA_Out 119 for the output signals are both arranged on the wafer frontside, making for a more interconnect routing efficient for an inverter semiconductor shown.

EXAMPLE EMBODIMENTS

Figure 2A:
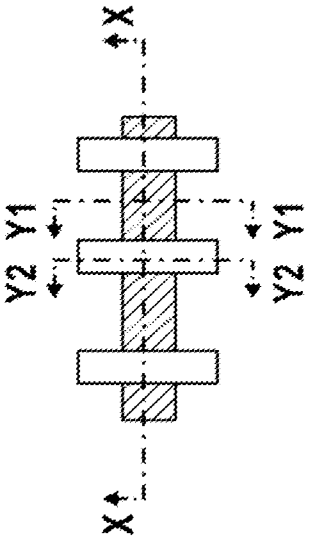
FIGS. 2A and 2B illustrate a top view showing sectioning and a cross-sectional view of a process flow for fabricating an inverter semiconductor device after providing a starting wafer, consistent with an illustrative embodiment.
Figure 2B:
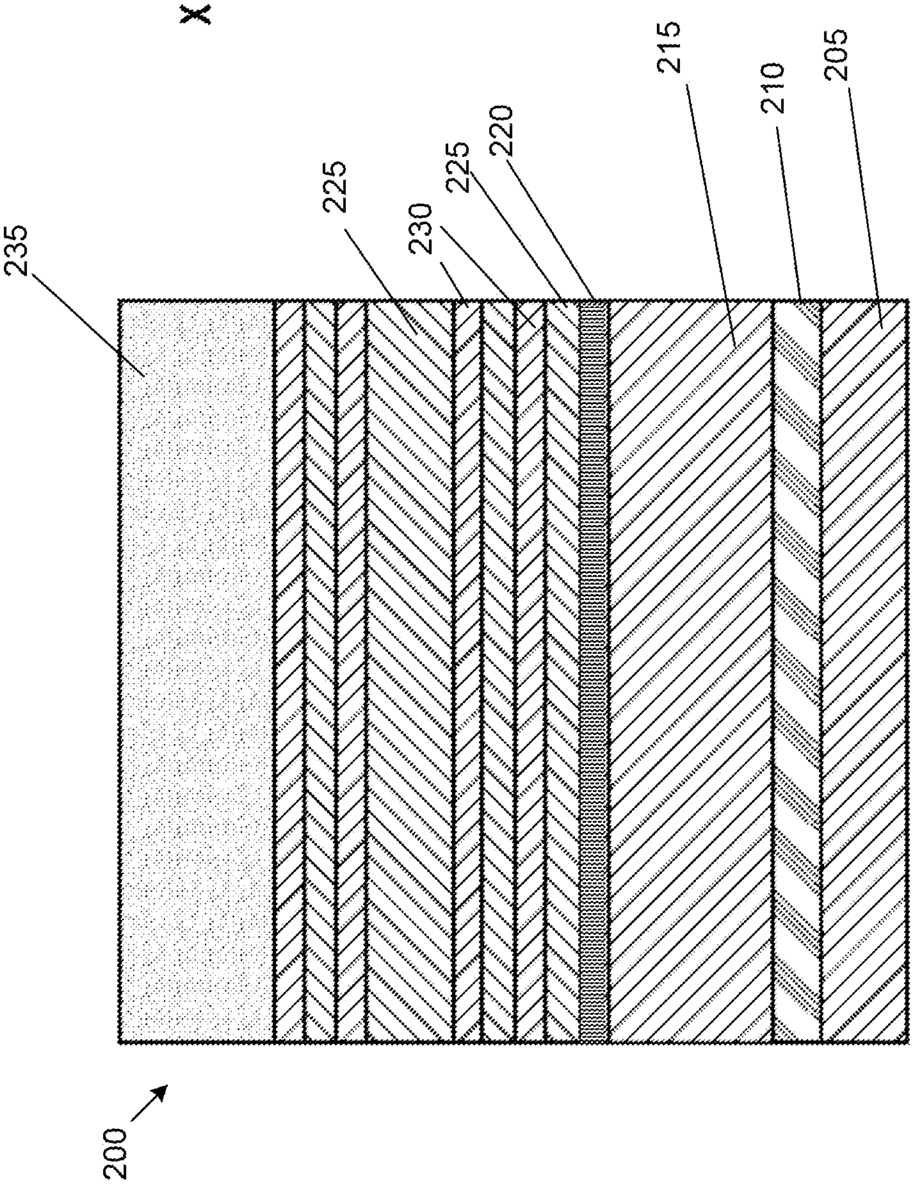

FIGS. 2A and 2B illustrate a top view showing sectioning and a cross-sectional view of a process flow for fabricating an inverter semiconductor device after providing a starting wafer, consistent with an illustrative embodiment. A starting wafer 200 is provided having a first substrate 205, and an etch stop layer 210 arranged on the first substrate 205, followed by the remainder of the substrate, referred to as a second substrate 215. There is a sacrificial layer 220, that may be made of a relatively high Ge concentration such as a layer with a germanium concentration of, for example, about 60 percent, and arranged on the second substrate 215. There are also stacked alternating layers of, sacrificial layer 225 with, for example, a germanium concentration of about 30 percent, and channel layer 230 with for example, a Si layer, forming a stack. Hard Mask 235 is arranged on top of the alternating layers of sacrificial layer 225 and channel layer 230. It is to be understood that the sacrificial layer 220 is not limited to a germanium concentration of 60 percent. For example, the relatively high Ge concentration for the sacrificial layer 220 ranges from about 45% to 70%. The plurality of sacrificial layers 225 may be constructed of a relatively lower concentration Ge in an SiGe material in the range of about 15% to 35% Ge.

The first substrate 205 and the second substrate 215 may be constructed of Si, but the type of substrate is not limited to Si. For example, the first substrate 205 and the second substrate 215 can be made of any suitable substrate material, such as, for example, SiOC, (carbon doped silicon), carbon doped silicon germanium (SiGe:C), III-V, II-V compound semiconductor, semiconductor-on-insulator (SOI), or another like semiconductor.

Figure 3A:
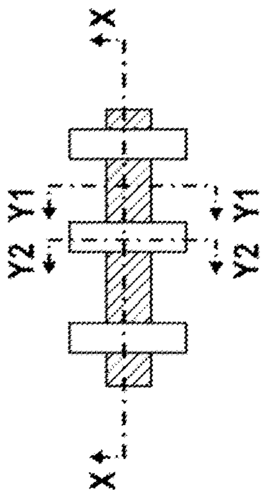
FIGS. 3A, 3B, and 3C illustrate a top view showing sectioning and cross-sectional views of a process flow for fabricating an inverter semiconductor device after nanosheet stack patterning and a shallow trench isolation formation, consistent with an illustrative embodiment.
Figure 3C:
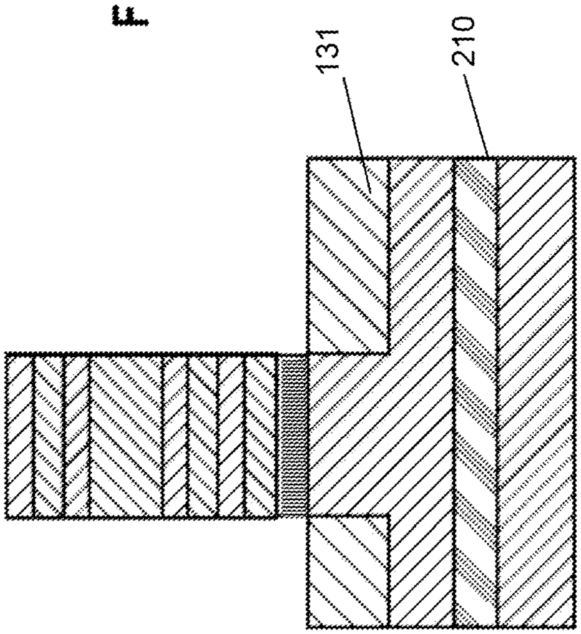
Figure 3B:
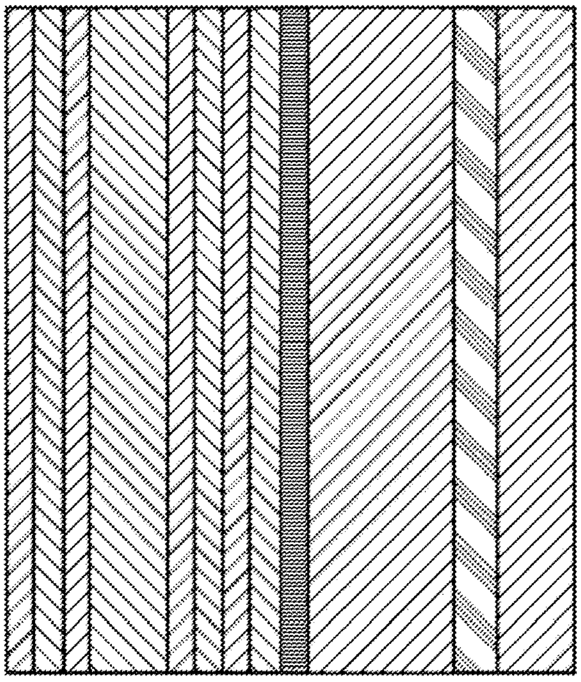

FIGS. 3A, 3B, and 3C illustrate a top view showing sectioning and cross-sectional views of a process flow for fabricating an inverter semiconductor device after nanosheet stack patterning and a shallow trench isolation formation, consistent with an illustrative embodiment. The Y1 section view and the Y2 section view would be the same because there is not a gate stack, so FIG. 3C shows the Y1 cross-section. The STI 131 formation and the etch stop layer 210 in the cross-sectional view on the substrate were previously shown and described in FIGS. 1B-1C and FIG. 2.

FIGS. 4A, 4B, 4C, and 4D illustrate a top view showing sectioning and cross-sectional views of a process flow for fabricating an inverter semiconductor device after a dummy gate formation, consistent with an illustrative embodiment. In FIGS. 4B, and 4D, a dummy gate 440 and a gate hard mask (HM) 235 are stacked on the nanosheets. In FIG. 4B, there are multiple stacks of dummy gate 445 and the gate HM 235 on the nanosheets. In FIG. 4D, the dummy gate 440 and the gate hard mask 235 are arranged on the nanosheet stack on the STI 131. The dummy gate 440 serves as a placeholder and permits the placement of the source or drain regions of the device. Following formation of the source and drain regions, the dummy gate can be removed and replaced with a replacement gate stack. Thus, potential damage to the replacement gate stack (e.g., from processing conditions such as dopant implant and/or activation anneals) can be avoided since the gate stack is not formed until the end of the process. Suitable dummy gate materials include, but are not limited to, poly-silicon (or poly-Si).

Figure 5A:
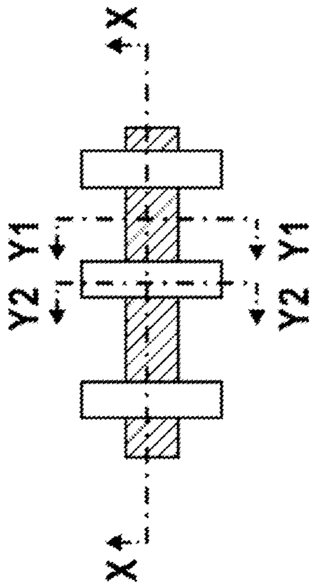
FIGS. 5A, 5B, 5C, and 5D illustrate a top view showing sectioning and cross-sectional views of a process flow for fabricating an inverter semiconductor device after a sacrificial layer removal, gate spacer and BDI formation, consistent with an illustrative embodiment.
Figure 5B:
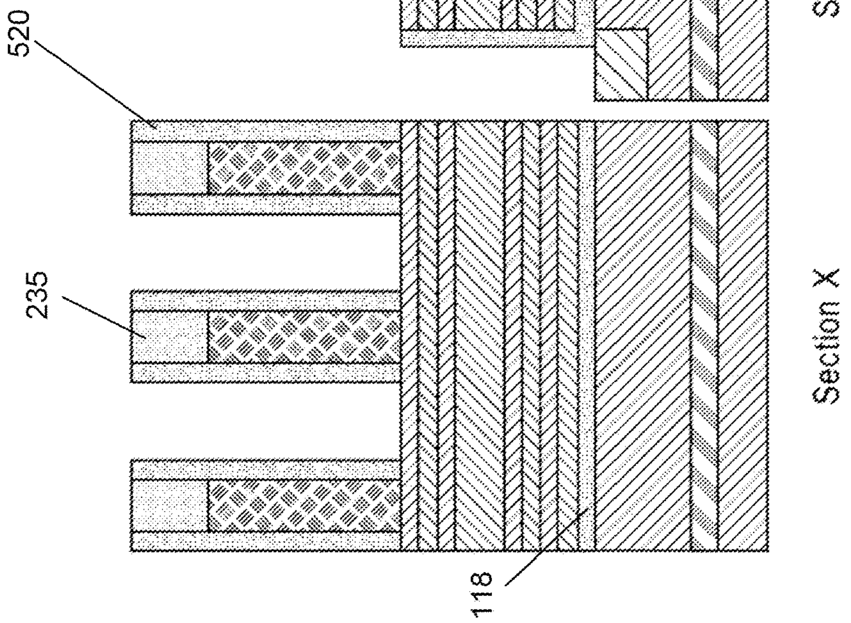
Figure 5C:
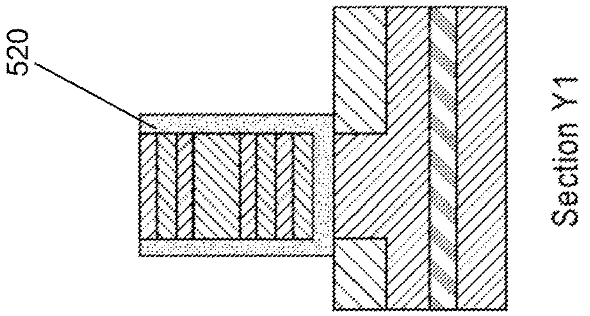
Figure 5D:
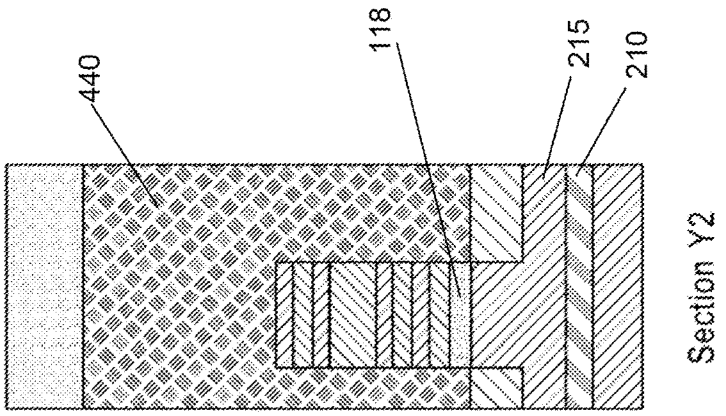
Figure 7A:
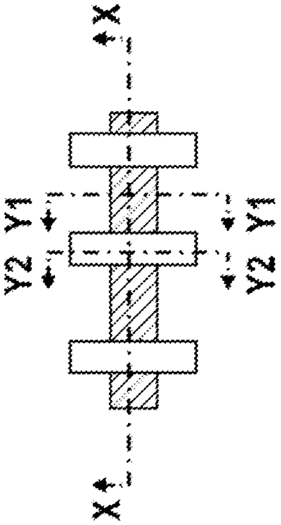
FIGS. 7A, 7B, 7C, and 7D illustrate a top view showing sectioning and cross-sectional views of a process flow for fabricating an inverter semiconductor device after sacrificial placeholder growth, consistent with an illustrative embodiment.
Figure 7B:
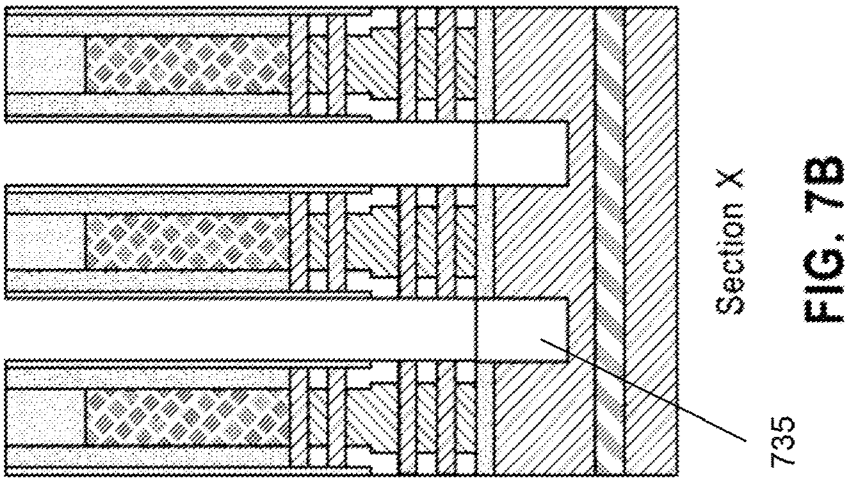
Figure 7C:
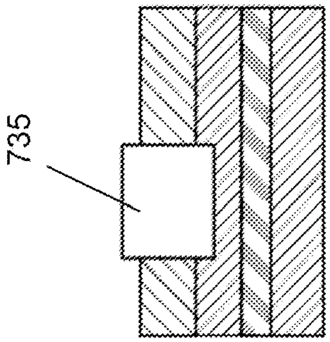
Figure 7D:
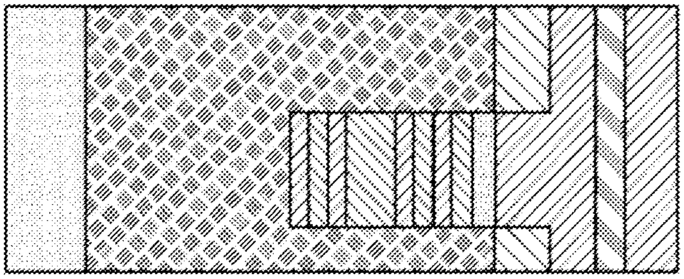

FIGS. 5A, 5B, 5C, and 5D illustrate a top view showing sectioning and cross-sectional views of a process flow for fabricating an inverter semiconductor device after sacrificial layer 220 (e.g., a layer with germanium concentration of about 60 percent) removal and BDI formation layer 118, consistent with an illustrative embodiment. As previous discussed, the sacrificial layer 220 is removed and a BDI formation layer 118 is placed on the substrate 215 where the sacrificial layer 220 was previously arranged. FIGS. 5B and 5C show a spacer material 520 is also arranged around the dummy gate 440 and hard mask 235 and on the sidewalls of nanosheet stack.

FIGS. 6A, 6B, 6C, and 6D illustrate a top view showing sectioning and cross-sectional views of a process flow for fabricating an inverter semiconductor device after formation of multiple substeps including a top FET NS recess, a bottom FET NS, a top FET sacrificial layer indentation, a top FET inner space formation, a liner deposition and break through, a bottom FET NS recess, a placeholder region recess, a bottom FET sacrificial layer indentation and a bottom FET inner spacer formation, consistent with an illustrative embodiment. For example, the top nanosheet recess with a sacrificial layer indentation and formation of inner spacer 625 is shown, and a deposition of the liner 630 around the spacer material 520, the channel layer 230 and the top FET inner spacer 625 with a breakthrough at the top of the stacks shown in FIG. 6B, and along the side to facilitate a continuous recess. For example, a placeholder recess 634 is made in the second substrate 215. There is also shown a bottom FET inner spacer formation 632 at a lower portion of the nanosheet stacks.

FIGS. 7A, 7B, 7C and 7D illustrate a top view showing sectioning and cross-sectional views of a process flow for fabricating an inverter semiconductor device after sacrificial placeholder growth, consistent with an illustrative embodiment. Sacrificial placeholders 735 are arranged in the recesses 634 (shown in FIGS. 6B and 6C).

FIGS. 8A, 8B, 8C, and 8D illustrate a top view showing sectioning and cross-sectional views of a process flow for fabricating an inverter semiconductor device after NFET epitaxy growth, consistent with an illustrative embodiment. On top of the placeholders are growths of the bottom nFET epitaxy 117.

FIGS. 9A, 9B, 9C, and 9D illustrate a top view showing sectioning and cross-sectional views of a process flow for fabricating an inverter semiconductor device after an ILD fill, CMP and recess, liner strip, and pFET epitaxy growth, consistent with an illustrative embodiment. An interdielectric layer ILD 945 is first deposited on top of STI 131, bottom NFET epitaxy 117, hard mask 235 and on the sidewall of liner 630. Next, a chemical mechanical planarization (CMP) is performed, followed by recessing ILD 945 below the bottom channel layer 230 of the top PFET. Next, the liner 630 (shown in FIG. 6) is removed on the nanosheet stacks. A growth of the top PFET epitaxy 116 is arranged above the bottom NFET epitaxy growth 117, separated by an interdielectric layer ILD 945.

Figure 9A:
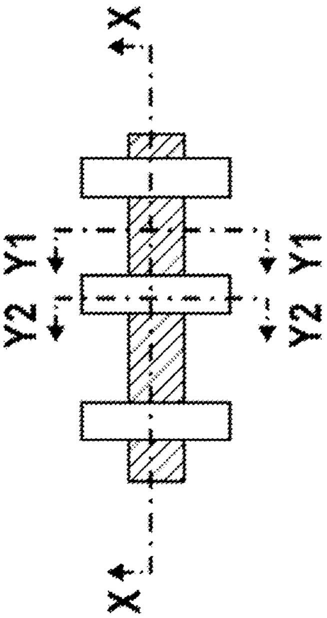
FIGS. 9A, 9B, 9C, and 9D illustrate a top view showing sectioning and cross-sectional views of a process flow for fabricating an inverter semiconductor device after an inter-layer dielectric (ILD) fill, chemical-mechanical polishing (CMP) and recess, a liner strip, and PFET epitaxy growth, consistent with an illustrative embodiment.
Figure 9B:
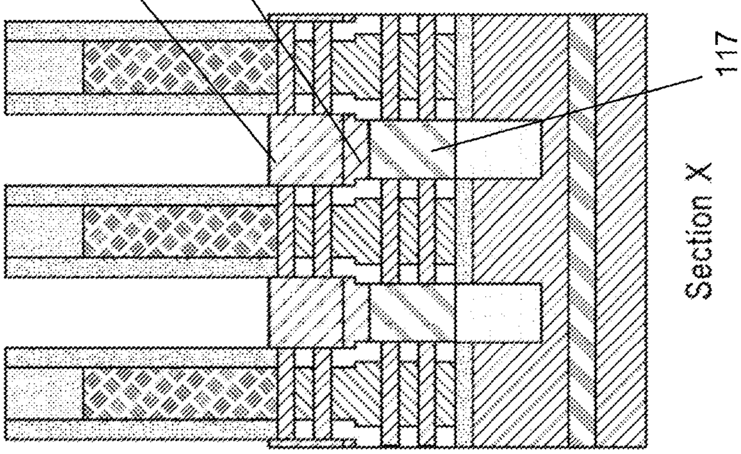
Figure 9C:
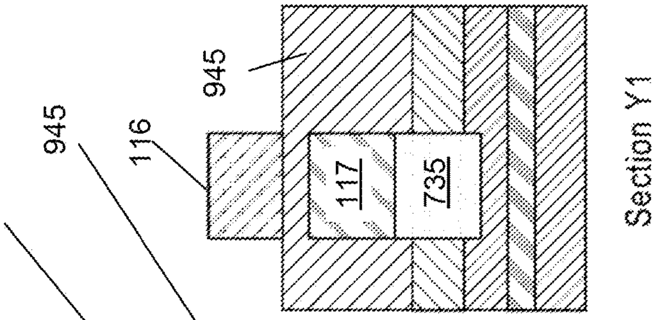
Figure 9D:
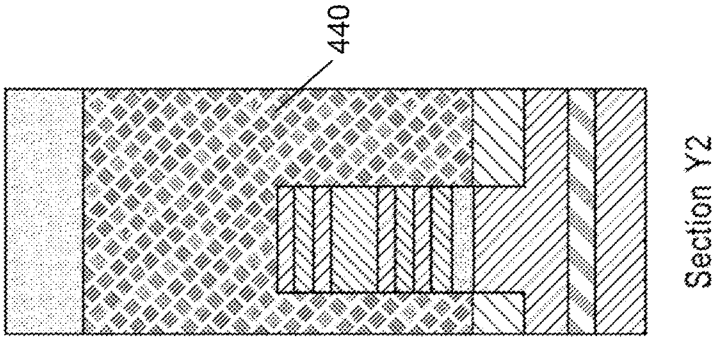
Figure 10A:
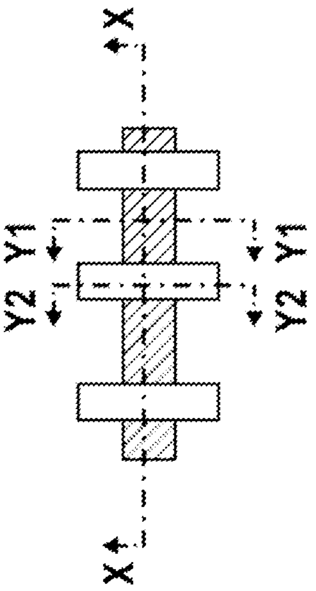
FIGS. 10A, 10B, 10C, and 10D illustrate a top view showing sectioning and cross-sectional views of a process flow for fabricating an inverter semiconductor device after forming an ILD recess to reveal a middle gap between NFET and PFET epitaxy, consistent with an illustrative embodiment.
Figure 10B:
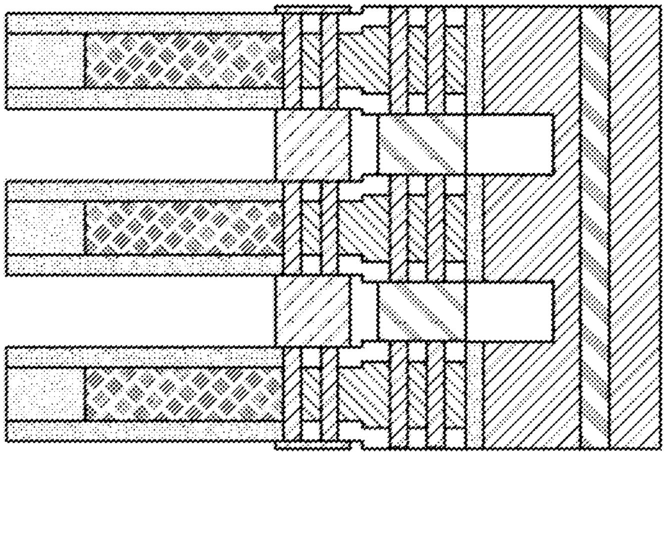
Figure 10C:
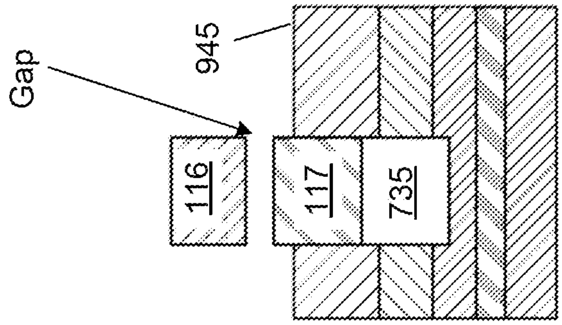
Figure 10D:
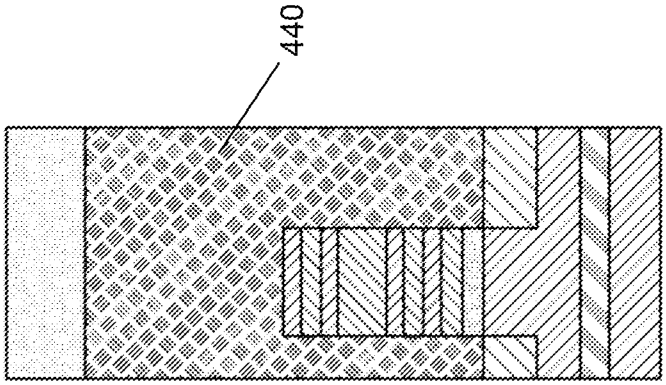

FIGS. 10A, 10B, 10C, and 10D illustrate a top view showing sectioning and cross-sectional views of a process flow for fabricating an inverter semiconductor device after n ILD recess to reveal a middle gap between NFET and PFET epitaxy, consistent with an illustrative embodiment. As shown particularly with reference to FIG. 10C, the ILD 945 is recessed back (such as shown in FIG. 9C) so as to create a gap between the bottom nFET epitaxy 117 and the top pFET epitaxy 116. The amount that the ILD 945 is recessed is not critical as long as the gap between the nFET epitaxy 117 and the pFET epitaxy 116 is revealed. The placeholder 735 remains during this part of the process flow.

Figure 11A:
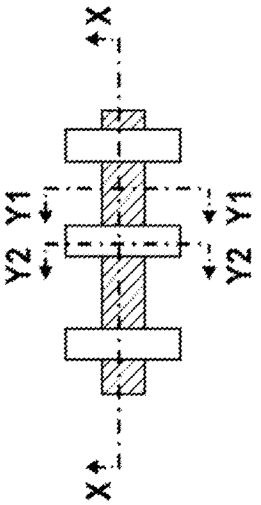
FIGS. 11A, 11B, 11C, and 11D illustrate a top view showing sectioning and cross-sectional views of a process flow for fabricating an inverter semiconductor device after formation of a divot fill and ILD backfill, consistent with an illustrative embodiment.
Figures 11B, 11C, 11D:
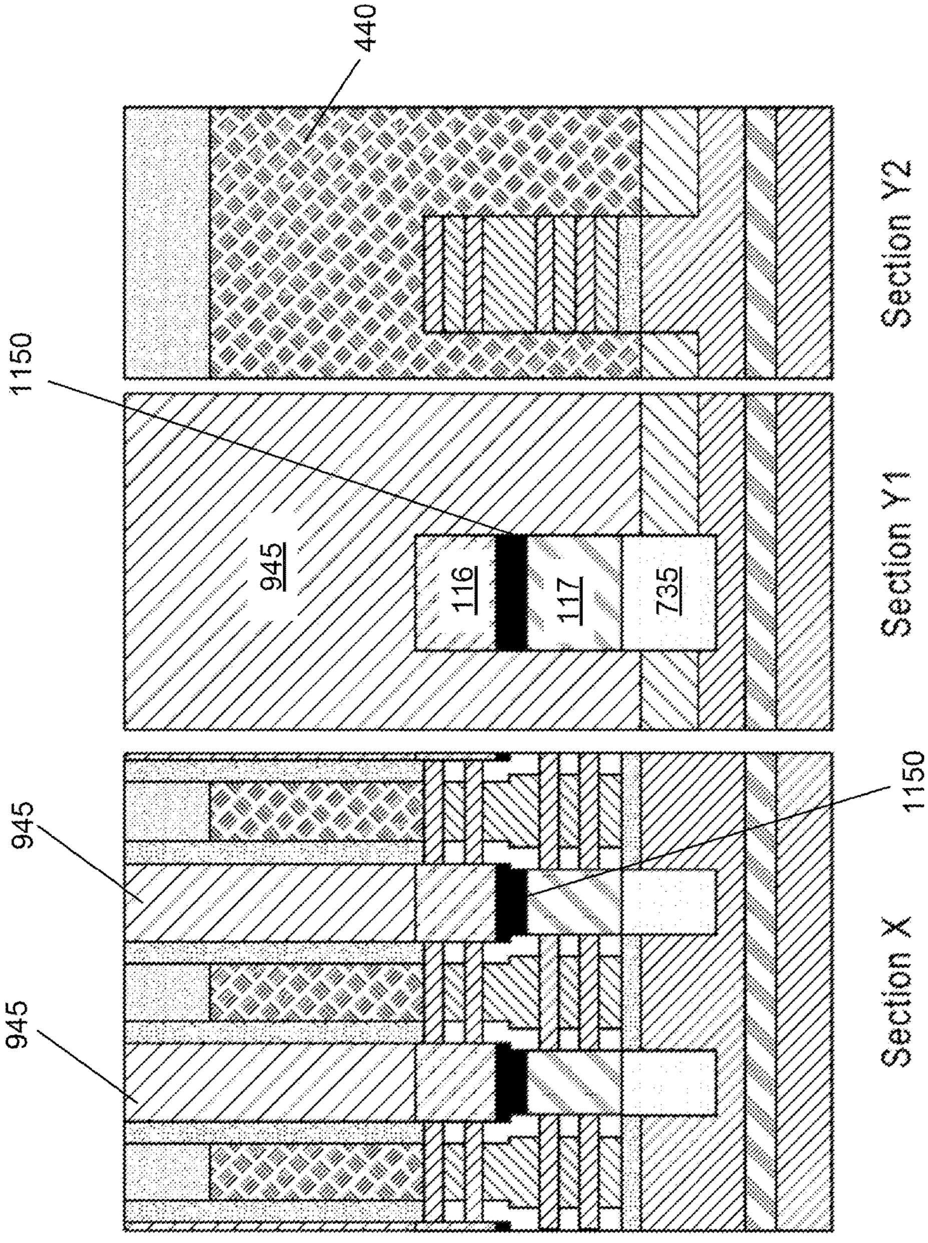

FIGS. 11A, 11B, 11C, and 11D illustrate a top view showing sectioning and cross-sectional views of a process flow for fabricating an inverter semiconductor device after formation of a dielectric divot fill and ILD backfill, consistent with an illustrative embodiment. Referring to FIG. 11C, a divot 1150 of a dielectric material such as SiC, or SiOC is filled in the gap between the bottom nFET epitaxy 117 and the top pFET epitaxy 116. Additional ILD 945 is deposited and planarized through, e.g., CMP, as shown in FIG. 11C, and the ILD 945 is deposited between the dummy gates 440 and spacer material 520 as shown in FIG. 11B.

FIGS. 12A, 12B, 12C, and 12D illustrate a top view showing sectioning and cross-sectional views of a process flow for fabricating an inverter semiconductor device after a stacked replacement metal gate formation, consistent with an illustrative embodiment. By performing CMP, the dummy gate 440 (e.g., dummy gate 440 in FIGS. 4D, 9D through 11D) is exposed and can be removed by, for example, a wet etch or a reactive ion etch process, and the SiGe layers (layers 230 in the nanosheet stacks as shown in FIG. 2B) are removed by, for example, a wet etch process. The dummy gate is replaced with a replacement metal gate (RMG) 1255. The RMG 1255 is a high-K/metal gate.

Figures 13A, 13B, 13C, 13D:
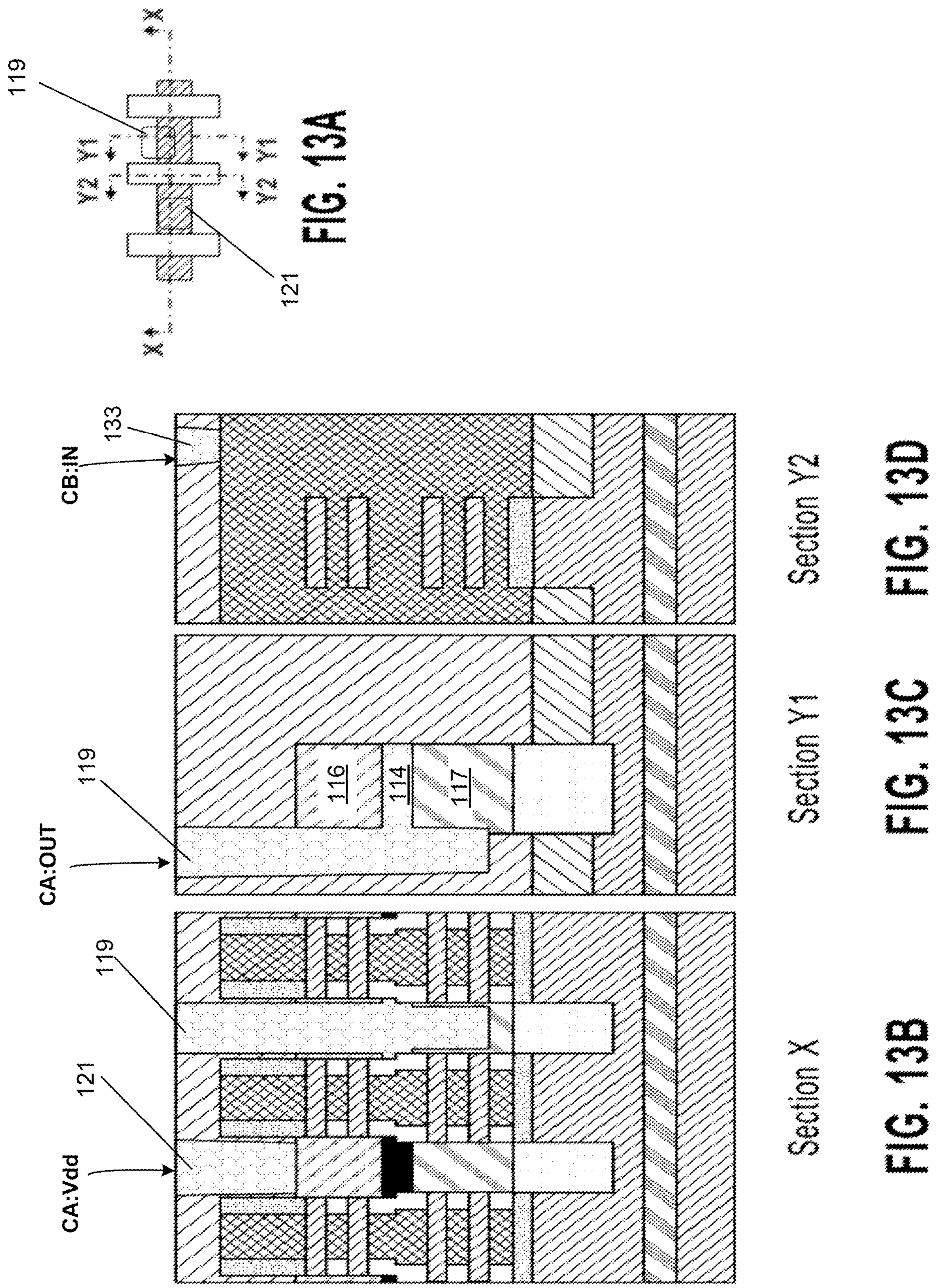
FIGS. 13A, 13B, 13C, and 13D illustrate a top view showing sectioning and cross-sectional views of a process flow for fabricating an inverter semiconductor device after additional ILD deposition, MOL patterning, divot fill removal, and MOL metallization, consistent with an illustrative embodiment.
Figures 14A, 14B, 14C, 14D:
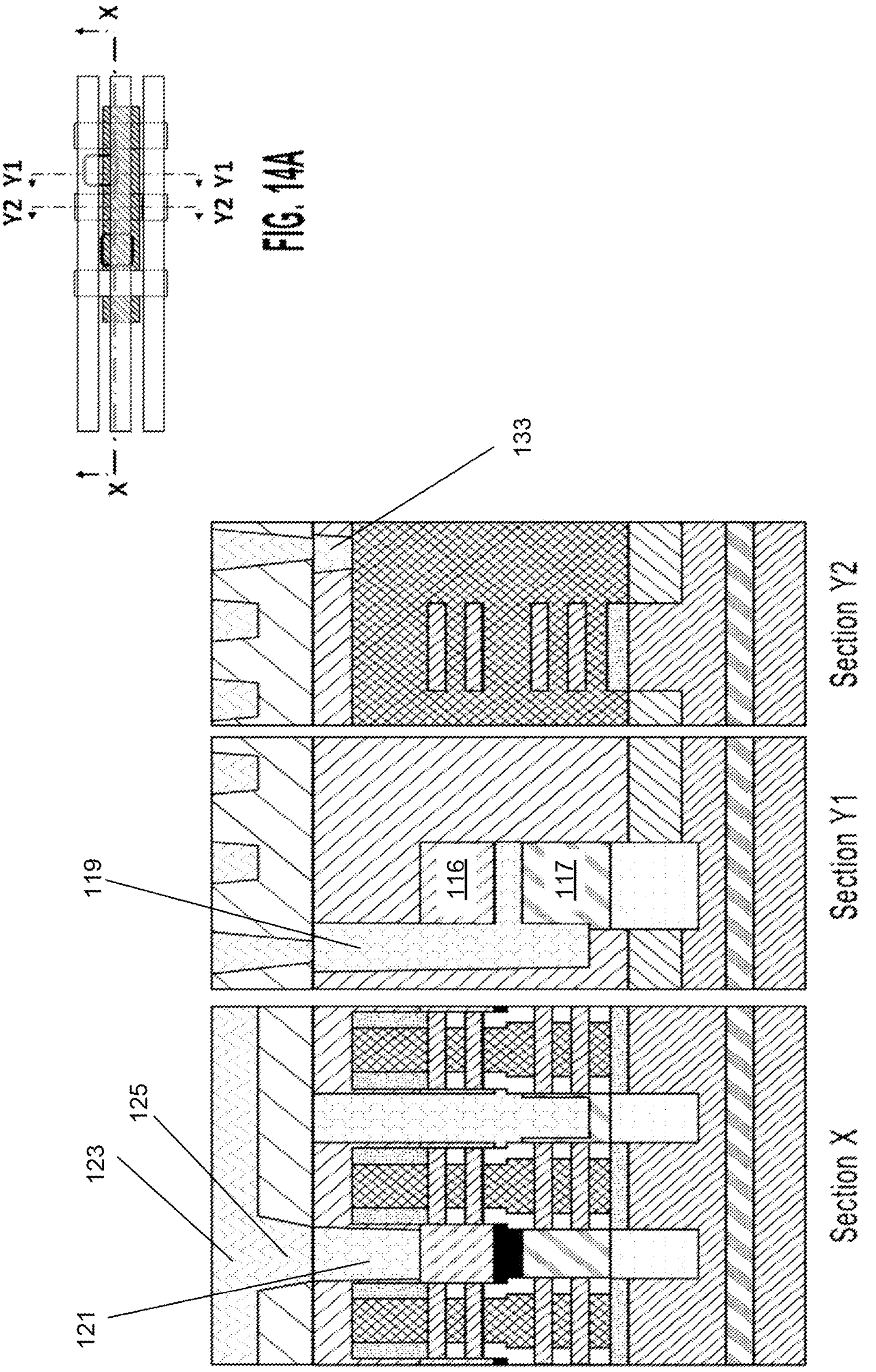
FIGS. 14A, 14B, 14C, and 14D illustrate a top view showing sectioning and cross-sectional views of a process flow for fabricating an inverter semiconductor device after an interconnect formation at M0 and V0 levels, consistent with an illustrative embodiment.
Figure 15A:
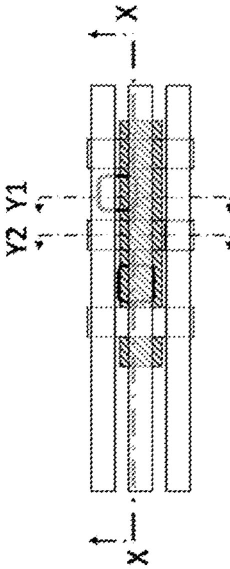
FIGS. 15A, 15B, 15C, and 15D illustrate a top view showing sectioning and cross-sectional views of a process flow for fabricating an inverter semiconductor device after BEOL and carrier wafer bonding, consistent with an illustrative embodiment.
Figure 15B:
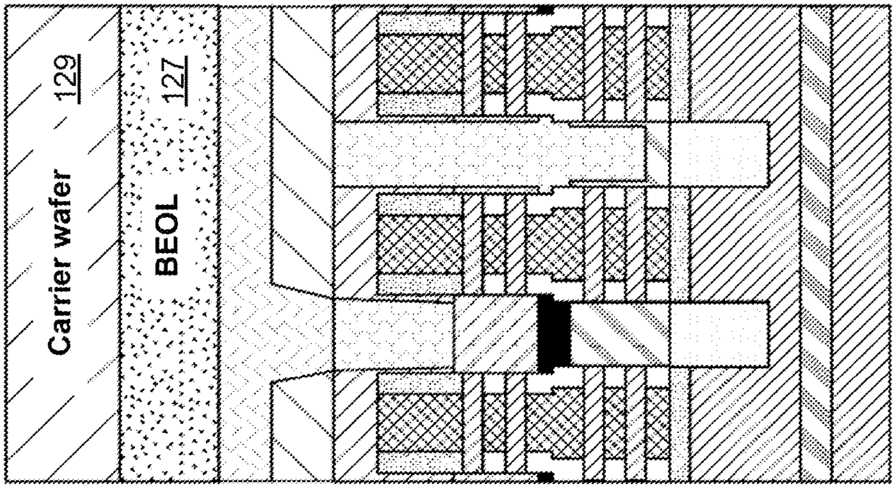
Figure 15C:
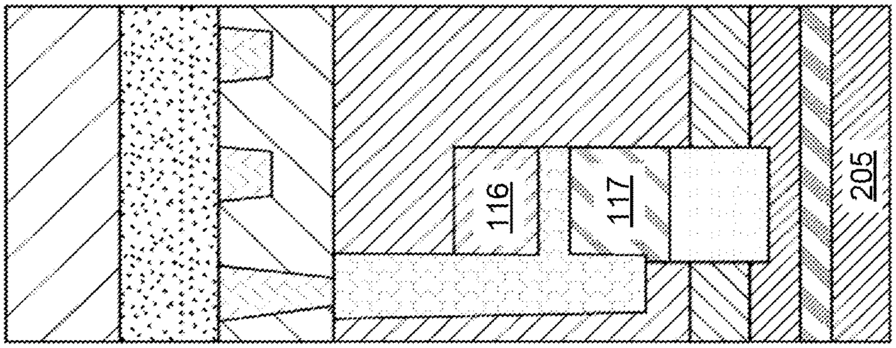
Figure 15D:
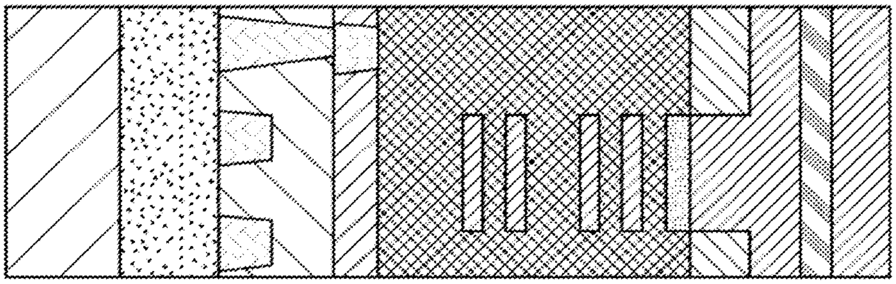
Figure 16A:
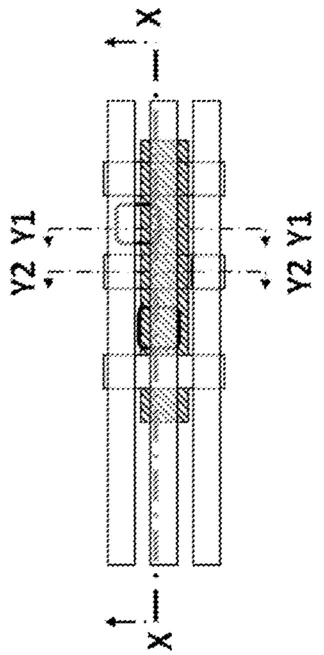
FIGS. 16A, 16B, 16C, and 16D illustrate a top view showing sectioning and cross-sectional views of a process flow for fabricating an inverter semiconductor device after a wafer flip, Si substrate removal to etch stop layer, consistent with an illustrative embodiment.
Figure 16B:
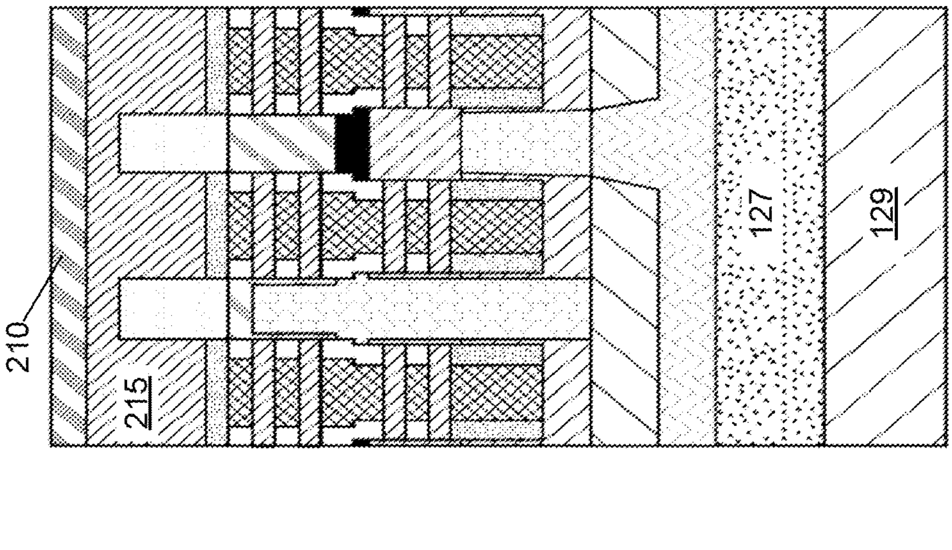
Figure 16C:
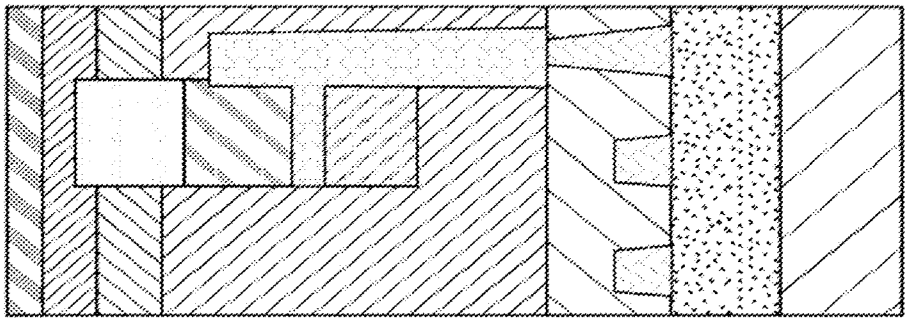
Figure 16D:
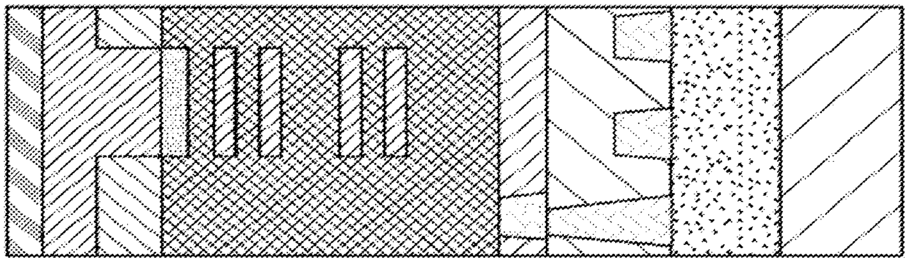
Figure 17A:
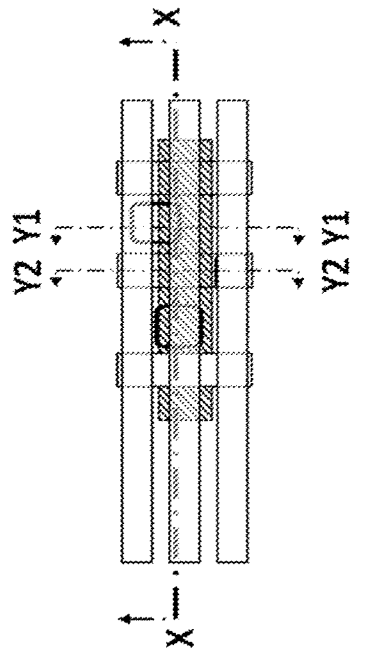
FIGS. 17A, 17B, 17C, and 17D illustrate a top view showing sectioning and cross-sectional views of a process flow for fabricating an inverter semiconductor device after an etch stop layer removal, a remaining Si substrate recess and backside interlayer dielectric (BILD) fill and CMP, consistent with an illustrative embodiment.
Figure 17B:
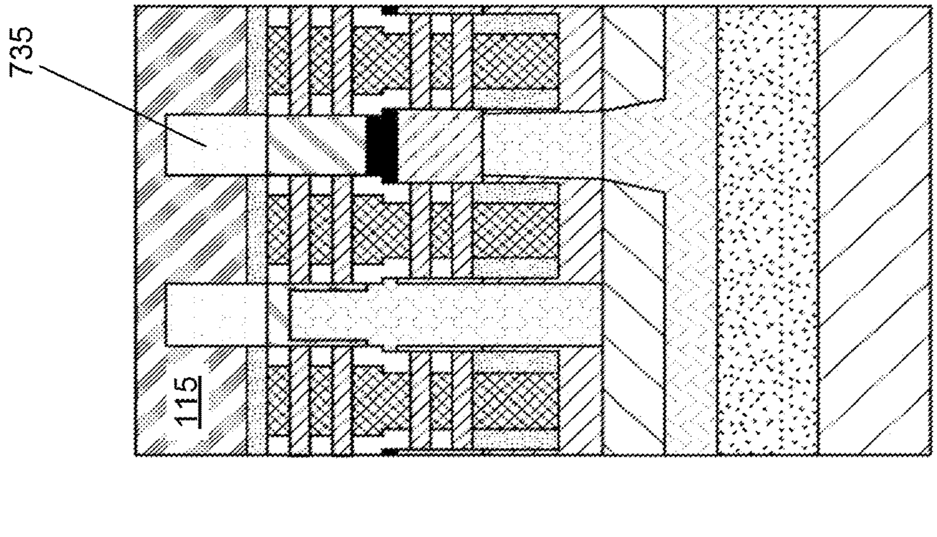
Figure 17C:
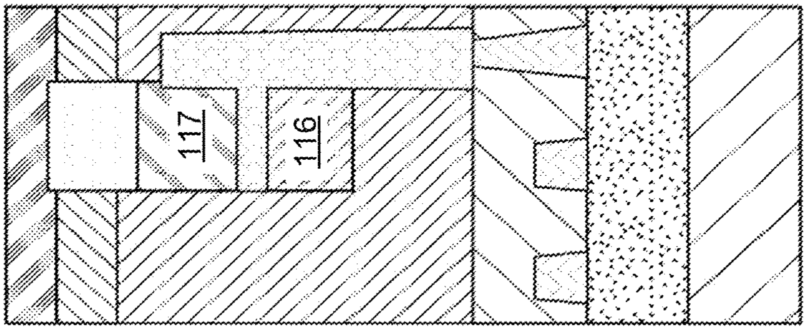
Figure 17D:
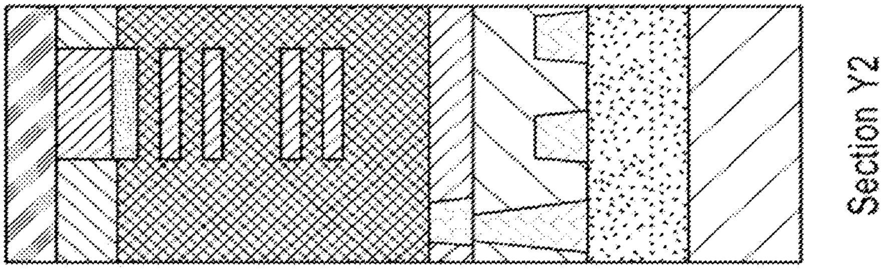
Figure 18A:
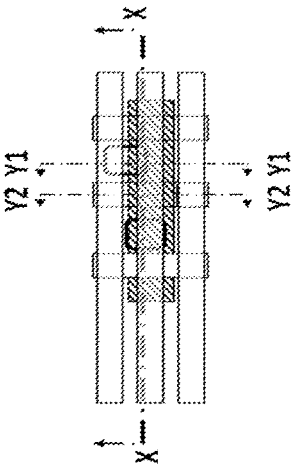
FIGS. 18A, 18B, 18C, and 18D illustrate a top view showing sectioning and cross-sectional views of a process flow for fabricating an inverter semiconductor device after wafer backside source and drain contact patterning, consistent with an illustrative embodiment.
Figure 18D:
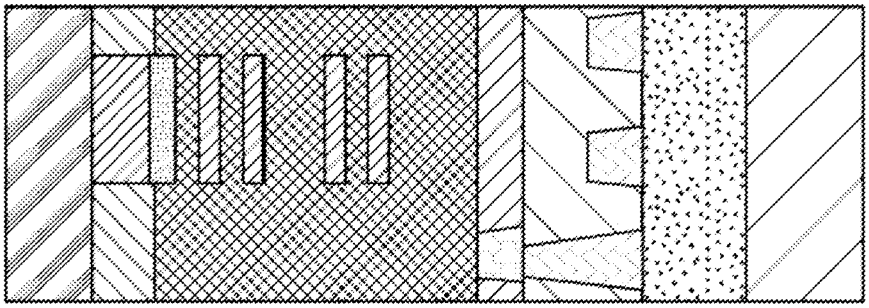
Figure 18C:
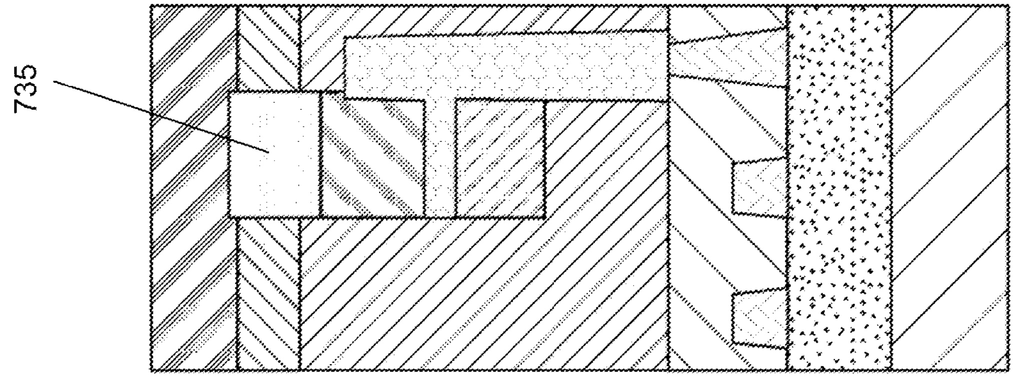
Figure 18B:
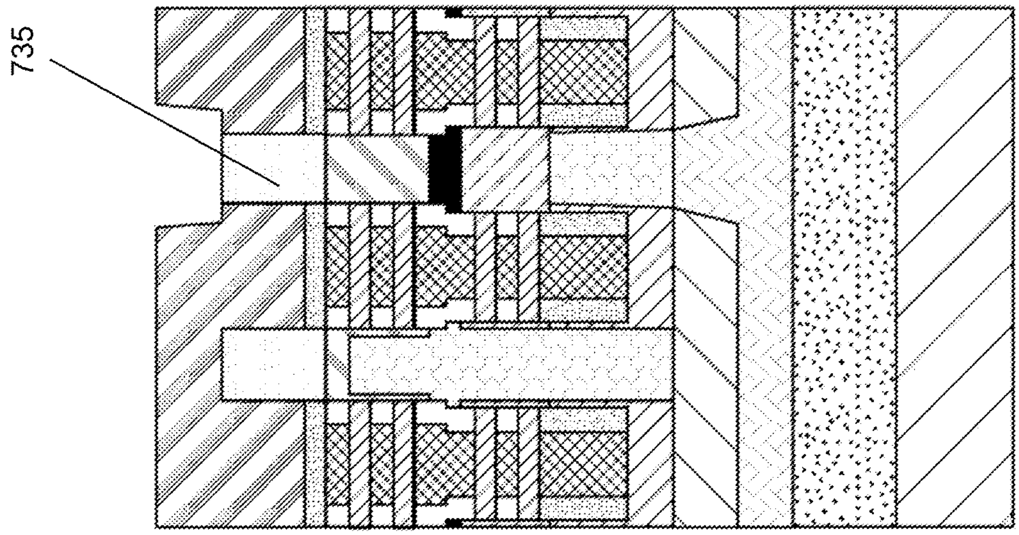

FIGS. 13A, 13B, 13C, and 13D illustrate a top view showing sectioning and cross-sectional views of a process flow for fabricating an inverter semiconductor device after MOL patterning, divot fill removal, and MOL metallization, consistent with an illustrative embodiment. The divot 1150 (shown in FIGS. 11 and 12) arranged between the bottom nFET epitaxy 117 and the top pFET epitaxy 116 is removed and replaced with a metal material to form a middle connection 114 for an output contact (CA_out 119) for the pair of nFET epitaxy 117 and pFET epitaxy 116 of the inverter. The input contact CB_In 133 is also provided as an MOL metal fill. FIGS. 13C and 13D show that the input and output contacts are provided on the frontside of the wafer for better interconnect routing efficiency.

FIGS. 14A, 14B, 14C, and 14D illustrate a top view showing sectioning and cross-sectional views of a process flow for fabricating an inverter semiconductor device after an interconnect formation at M0 and V0 levels, consistent with an illustrative embodiment. The Middle of Line interconnect M0_Vdd 123, and V0 125 are connected to the contact CA_Vdd 121.

FIGS. 15A, 15B, 15C, and 15D illustrate a top view showing sectioning and cross-sectional views of a process flow for fabricating an inverter semiconductor device after BEOL and wafer bonding, consistent with an illustrative embodiment. The BEOL 127 is connected to the wafer. The carrier wafer 129 is attached to the BEOL 127 to facilitate handling, such as flipping the wafer for the wafer backside fabrication process.

FIGS. 16A, 16B, 16C, and 16D illustrate a top view showing sectioning and cross-sectional views of a process flow for fabricating an inverter semiconductor device after a wafer flip, Si substrate removal to etch stop layer, consistent with an illustrative embodiment. After the wafer is flipped, the first substrate 205 (shown in FIG. 2 and FIG. 15C) is removed up to the etch stop layer 210. The first substrate 205 may be removed by grinding, CMP and/or wet etch. The etch stop layer 210 is used to compensate for any thickness variations in the upper portion of the substrate layer grinding and CMP operations.

FIGS. 17A, 17B, 17C, and 17D illustrate a top view showing sectioning and cross-sectional views of a process flow for fabricating an inverter semiconductor device after an etch stop layer removal, the remaining Si substrate recess and BILD fill and CMP, consistent with an illustrative embodiment. The etch stop layer 210 and the remaining substrate 215 are removed, and the BILD 115 is used to fill in where the substrate 215 was removed, and CMP is performed.

FIGS. 18A, 18B, 18C, and 18D illustrate a top view showing sectioning and cross-sectional views of a process flow for fabricating an inverter semiconductor device after backside source and drain contact patterning, consistent with an illustrative embodiment. A backside source and drain contact patterning are performed and a portion of the BILD 115 is removed to access and remove the placeholder 735.

FIGS. 19A, 19B, 19C, and 19D illustrate a top view showing sectioning and cross-sectional views of a process flow for fabricating an inverter semiconductor device after a self-align placeholder removal and backside source and drain contact formation, consistent with an illustrative embodiment. The BSCA_VSS 111 contact is formed by selectively removing the placeholder 735 and filling the removed placeholder and partially removed BILD with a metal.

FIGS. 20A, 20B, 20C, and 20D illustrate a top view showing sectioning and cross-sectional views of a process flow for fabricating an inverter semiconductor device after a backside interconnect formation at M0 and V0 levels, consistent with an illustrative embodiment. The BSM0_Vss 107 is arranged at the wafer backside. The BSV0 109 is connected to the contact BSCA_VSS 111.

The finished semiconductor is shown in FIG. 1, which has been discussed in detail herein above that shows the BSPDN 105 arranged on the BSM0_VSS 107.

Example Process

With the foregoing overview of the example architecture, it may be helpful now to consider a high-level discussion of an example process. To that end, FIG. 21 is a flowchart illustrating a method of forming an inverter in a semiconductor device, consistent with respective illustrative embodiments discussed in the flow process of FIGS. 2-20.

Figure 21:
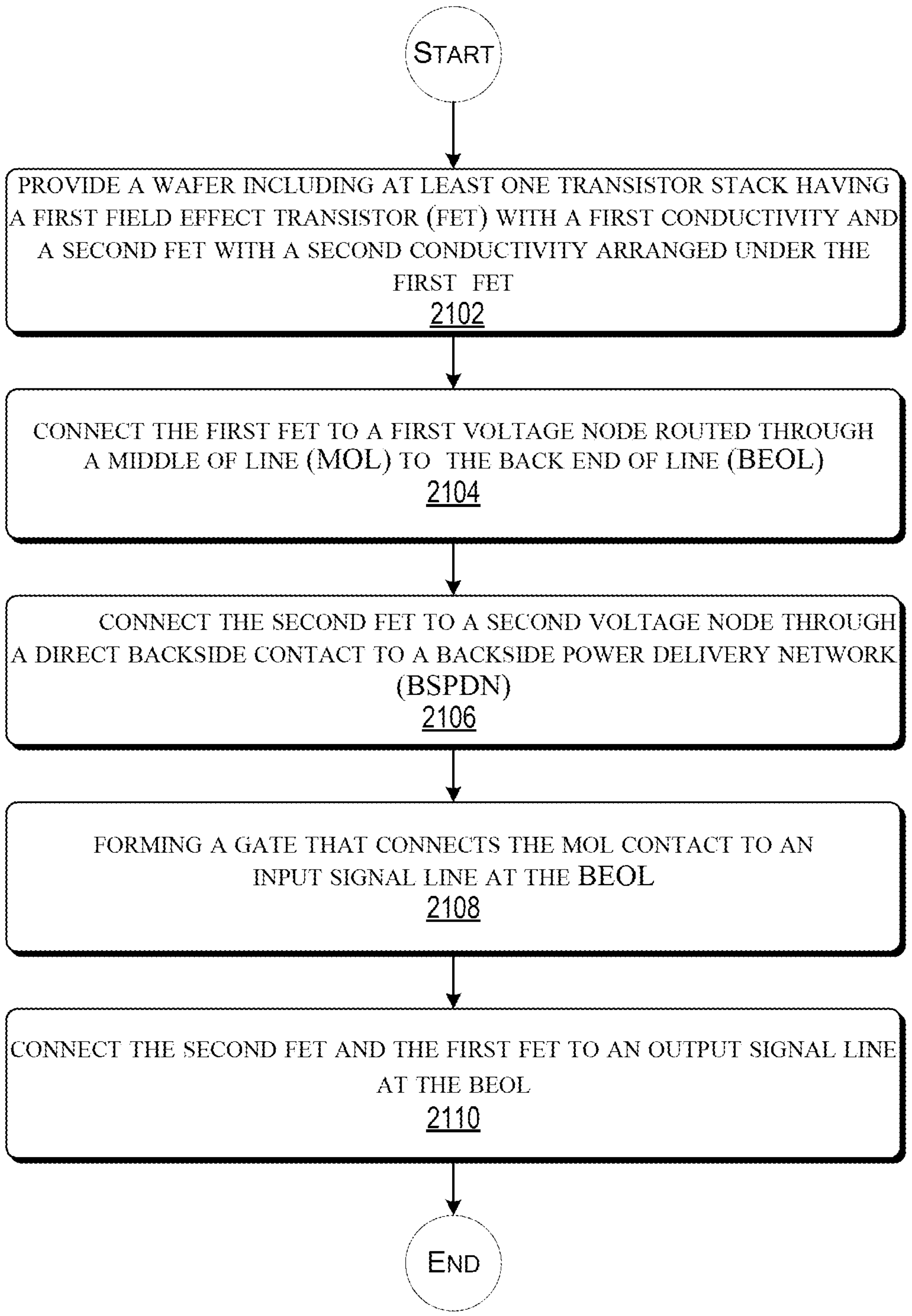
FIG. 21 is a flowchart illustrating a method of making an inverter semiconductor device, consistent with an illustrative embodiment.

FIG. 21 is shown as a collection of blocks, in a logical order, which represents a sequence of operations that can be implemented in hardware, software, or a combination thereof. In each process, the order in which the operations are described is not intended to be construed as a limitation, and any number of the described blocks can be combined in any order and/or performed in parallel to implement the process.

At operation 2102, a starting wafer is provided with a transistor stack. For example, a first FET epitaxy with a first conductivity (p-type) may be arranged on a second FET epitaxy with a second conductivity (N-type). The transistor stack may be a nanosheet FET stack, and their arrangement may form an inverter device. FIG. 1C shows a first FET epitaxy 116 and a second FET epitaxy 117 (the wafer will be flipped during the construction).

At operation 2104, the first FET is connected to a voltage node VDD, being routed through a Middle of Line (MOL) to the back end of line (BEOL). Referring to FIG. 1, the first FET 116 is connected to a source or drain contact CA_Vdd 121.

At operation 2106, the second FET 117 is connected to a voltage node Vss through a direct backside contact to a backside power delivery network (BSPDN). FIG. 1 shows the BSPDN 105.

At operation 2108, a gate connects the MOL contact to an input signal at the BEOL. The Middle of the Line (MOL), gate input signals CB_In 133 is connected to the BEOL 127.

At operation 2110, the second FET 117 and the first FET 116 are connected to output contact (CA_Out) 119 to an output signal line at the BEOL 127. The method ends after operation 2108.

With regard to the method described above in the flowchart of FIG. 21, it will be understood that this embodiment is not exhaustive of the scope of the disclosure. For example, the methods may include one or more operations in addition to, or in lieu of, other operations.

The finished structure is shown back in FIG. 1, which illustrates the addition of the BSPDN.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowcharts, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device comprising:

a wafer having a frontside and a backside;

a first field effect transistor (FET) having a first conductivity, the first FET arranged on the frontside of the wafer;

a second FET having a second conductivity, the second FET arranged under the first FET to form a stack, the second FET arranged on the frontside of the wafer;

a Middle of Line (MOL) contact having a first end connected to a source or drain of the first FET, and a second end connected to a first voltage node;

a direct backside contact connected to a backside power delivery network (BSPDN), the direct backside contact having a first end connected to a source or drain of the second FET, and a second end connected to a second voltage node; and a Back End of Line (BEOL) formed on the frontside of the wafer having an input signal line and an output signal line, wherein:

a gate region connects the MOL contact to the input signal line at the BEOL; and an output of the first FET and an output of the second FET are connected through the MOL contact to the output signal line at the BEOL.

2. The semiconductor device according to claim 1, further comprising a middle connection that connects the first FET to the second FET, wherein the middle connection is connected to the MOL contact.

3. The semiconductor device according to claim 2, wherein the middle connection comprises a single metallic compound.

4. The semiconductor device according to claim 2, wherein the middle connection comprises two or more metallic compounds.

5. The semiconductor device according to claim 2, further comprising an inverter device, wherein the first FET comprises a p-type FET (pFET), and the second FET comprises an n-type FET (nFET).

6. The semiconductor device according to claim 5, wherein the pFET and the nFET comprise an epitaxial material.

7. The semiconductor device according to claim 5, wherein the gate region comprises a replacement metal gate (RMG) and a high-k metal gate (HKMG) material.

8. The semiconductor device according to claim 5, further comprising a plurality of input signals, wherein a plurality of output signals lines are all arranged at the BEOL on the frontside of the wafer.

9. The semiconductor device according to claim 1, further comprising an inverter having both the input signal line and the output signal line routed through the frontside of the wafer to the BEOL.

10. The semiconductor device according to claim 1, further comprising an input contact for the input signal line and an output contact for the output signal line only on the frontside of the wafer.

11. An inverter semiconductor device, comprising:

a wafer having a frontside and a backside;

a first field effect transistor (FET) having a first conductivity, wherein the first FET is arranged on the frontside of the wafer;

a second FET having a second conductivity different than the first conductivity, wherein the second FET arranged under the first FET to form a stack, wherein the second FET is arranged on the frontside of the wafer;

a back end of line (BEOL) layer arranged on the frontside of the wafer having an input signal line and an output signal line;

a Middle of Line (MOL) contact comprising at least one layer connected to the BEOL layer; and a gate arranged to connect the MOL contact to the input signal line at the BEOL layer, wherein:

the first FET is connected to a first voltage node routed through the MOL to the BEOL layer;

the second FET is connected to a second voltage node through a direct backside contact to a backside power delivery network (BSPDN); and the first FET and the second FET are connected to the output signal line at the BEOL layer.

12. The inverter semiconductor device according to claim 11, further comprising a middle connection arranged between the first FET and the second FET, wherein the first FET and the second FET are connected together through the middle connection.

13. The inverter semiconductor device according to claim 12, wherein:

the input signal line comprises a plurality of input signal lines;

the output signal line comprises a plurality of output signal lines; and the plurality of input signal lines and the plurality of the output signals lines are arranged at the BEOL layer.

14. The inverter semiconductor device according to claim 12, wherein:

the first FET comprises a first pFET epitaxy; and the second FET comprises a second nFET epitaxy.

15. The inverter semiconductor device according to claim 13, wherein the gate comprises a replacement metal gate (RMG) including a high-k metal gate (HKMG) material.

* * * * *